United States Patent
Song

(10) Patent No.: US 12,254,937 B2
(45) Date of Patent: Mar. 18, 2025

(54) SEMICONDUCTOR DEVICE AND METHOD FOR PERFORMING TEST

(71) Applicant: SK hynix Inc., Icheon-si Gyeonggi-do (KR)

(72) Inventor: Choung Ki Song, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 234 days.

(21) Appl. No.: 18/096,407

(22) Filed: Jan. 12, 2023

(65) Prior Publication Data

US 2024/0120015 A1    Apr. 11, 2024

(30) Foreign Application Priority Data

Oct. 6, 2022   (KR) .......................... 10-2022-0128187

(51) Int. Cl.
| | |
|---|---|
| *G11C 29/04* | (2006.01) |
| *G11C 29/02* | (2006.01) |
| *G11C 29/12* | (2006.01) |
| *G11C 29/14* | (2006.01) |

(Continued)

(52) U.S. Cl.
CPC ............ *G11C 29/14* (2013.01); *G11C 29/023* (2013.01); *G11C 29/04* (2013.01); *G11C 29/1201* (2013.01); *G11C 29/12015* (2013.01); *G11C 29/18* (2013.01); *G11C 2029/0409* (2013.01); *G11C 29/36* (2013.01); *G11C 2207/2254* (2013.01)

(58) Field of Classification Search
CPC ....... G11C 29/14; G11C 29/023; G11C 29/04; G11C 29/1201; G11C 29/12015; G11C 29/18; G11C 29/36; G11C 2029/0409; G11C 2207/2254

See application file for complete search history.

(56) References Cited

U.S. PATENT DOCUMENTS

| | | | |
|---|---|---|---|
| 6,750,692 B2 * | 6/2004 | Jang .......................... | G06F 1/04 327/293 |
| 6,907,555 B1 | 6/2005 | Nomura et al. | |

(Continued)

FOREIGN PATENT DOCUMENTS

KR    1020080046973 A    5/2008

*Primary Examiner* — Huan Hoang
*Assistant Examiner* — Justin Bryce Heisterkamp
(74) *Attorney, Agent, or Firm* — WILLIAM PARK & ASSOCIATES LTD.

(57) ABSTRACT

A semiconductor device includes a self-test circuit configured to generate an internal clock having a higher frequency than a clock applied from a device external to the semiconductor device, to generate an instruction signal from a pre-instruction signal extracted through a data line, and to generate an internal control signal from the instruction signal. The semiconductor device also includes a command control circuit configured to generate a test command to perform a self-test for determining whether a defect has occurred in first memory cells and second memory cells based on the internal clock and the internal control signal. The semiconductor device further includes a data control circuit configured to output data stored in the first memory cells based on the test command, and to store data output from the first memory cells in the second memory cells.

41 Claims, 22 Drawing Sheets

(51) Int. Cl.
*G11C 29/18* (2006.01)
*G11C 29/36* (2006.01)

(56) References Cited

U.S. PATENT DOCUMENTS

| | | | | |
|---|---|---|---|---|
| 7,673,209 | B2* | 3/2010 | Park | G11C 29/14 |
| | | | | 714/738 |
| 8,610,479 | B2* | 12/2013 | Lee | H03L 7/22 |
| | | | | 327/39 |
| 8,841,960 | B2* | 9/2014 | Cho | G06F 1/04 |
| | | | | 327/540 |
| 10,552,261 | B2* | 2/2020 | Hashizume | G06F 3/0659 |
| 2004/0260987 | A1* | 12/2004 | Ohlhoff | G11C 29/40 |
| | | | | 714/718 |
| 2007/0280032 | A1* | 12/2007 | Kwak | G11C 8/10 |
| | | | | 365/233.5 |
| 2008/0103719 | A1* | 5/2008 | Seong | G11C 29/14 |
| | | | | 702/125 |
| 2009/0183032 | A1* | 7/2009 | Frey | G11C 29/50 |
| | | | | 365/201 |
| 2010/0302889 | A1* | 12/2010 | Sawamura | G11C 11/406 |
| | | | | 365/230.03 |
| 2014/0258780 | A1* | 9/2014 | Eyres | G11C 29/4401 |
| | | | | 714/30 |
| 2017/0017258 | A1* | 1/2017 | Park | G06F 1/04 |
| 2021/0407574 | A1* | 12/2021 | Kim | G11C 7/1072 |
| 2022/0059143 | A1* | 2/2022 | Kim | G11C 29/023 |
| 2022/0084615 | A1* | 3/2022 | Uemura | G11C 29/50012 |
| 2022/0113889 | A1* | 4/2022 | Park | G11C 29/022 |
| 2022/0131532 | A1* | 4/2022 | Tian | G11C 29/12015 |
| 2022/0343995 | A1* | 10/2022 | Mishra | G11C 29/26 |

\* cited by examiner

| T/N | NCMD/TCMD | BG/BK (TIF) | ADD (TIF) |
|---|---|---|---|
| 1 bit | 5 bit | 5 bit | 5 bit |

(b)

| T/N | NCMD | BG/BK | ADD |
|---|---|---|---|
| 0 | 5 bit | 5 bit | 5 bit |

(c)

| T/N | TCMD | TIF |
|---|---|---|
| 1 | 5 bit | 10 bit |

FIG.13

| T/N | NCMD/TCMD | BG/BK (TIF) | ADD (TIF) |
|---|---|---|---|
| 1 bit | 5 bit | 5 bit | 21 bit |

SEMICONDUCTOR DEVICE AND METHOD FOR PERFORMING TEST

CROSS-REFERENCE TO RELATED APPLICATIONS

The present application claims priority under 35 U.S.C. 119(a) to Korean Patent Application No. 10-2022-0128187, filed on Oct. 6, 2022, in the Korean Intellectual Property Office, which is incorporated herein by reference in its entirety.

BACKGROUND

1. Technical Field

Embodiments of the present disclosure relate to semiconductor devices and methods for performing a test.

2. Related Art

In general, a semiconductor device may perform a test to determine whether a defect has occurred in memory cells included in banks or bank groups under the control of an external device. In a semiconductor, because the test performed based on the control of an external device is limited by the operating speed of the external device, research on a method for improving the operating speed at which the test is performed, regardless of the external device, is required.

SUMMARY

In accordance with an embodiment of the present disclosure, a semiconductor device includes a self-test circuit configured to generate an internal clock having a higher frequency than a clock applied from a device external to the semiconductor device, to generate an instruction signal from a pre-instruction signal extracted through a data line, and to generate an internal control signal from the instruction signal. The semiconductor device also includes a command control circuit configured to generate a test command to perform a self-test for determining whether a defect has occurred in first memory cells and second memory cells based on the internal clock and the internal control signal. The semiconductor device further includes a data control circuit configured to output data stored in the first memory cells based on the test command, and to store data output from the first memory cells in the second memory cells.

In accordance with an embodiment of the present disclosure, a semiconductor device includes an internal clock generating circuit configured to count a clock a preset number of times, and then, to calibrate a frequency of the internal clock based on a result of counting the clock. The semiconductor device also includes an instruction signal control circuit configured to generate an instruction signal based on a pre-instruction signal that is extracted through a data line based on the internal clock and the buffer input signal. The semiconductor device further includes an internal control signal generating circuit configured to generate an internal control signal including an instruction test command and instruction test information based on the instruction signal. The semiconductor device additionally includes a command control circuit configured to generate a test command to perform a self-test for determining whether a defect has occurred in the first memory cells and the second memory cells based on the internal clock and the internal control signal.

In accordance with the present disclosure is a method of performing a programming operation. The method includes generating an internal clock that is calibrated to have a higher frequency than a clock, storing data in first memory cells according to a normal write operation, storing an instruction signal in a buffer according to the normal write operation, and generating an internal control signal from the instruction signal. The method also includes generating a test command to perform a self-test to determine whether a defect has occurred in the first memory cells and the second memory cells based on the internal clock and the internal control signal. The method further includes outputting the data stored in the first memory cells and storing the data output from the first memory cells in second memory cells based on the test command.

BRIEF DESCRIPTION OF THE DRAWINGS

FIG. 12 shows tables illustrating instruction signals according to an embodiment of the present disclosure.

FIG. 13 is a table illustrating an instruction signal according to another embodiment of the present disclosure.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period in which the process or the algorithm is being executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of any of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
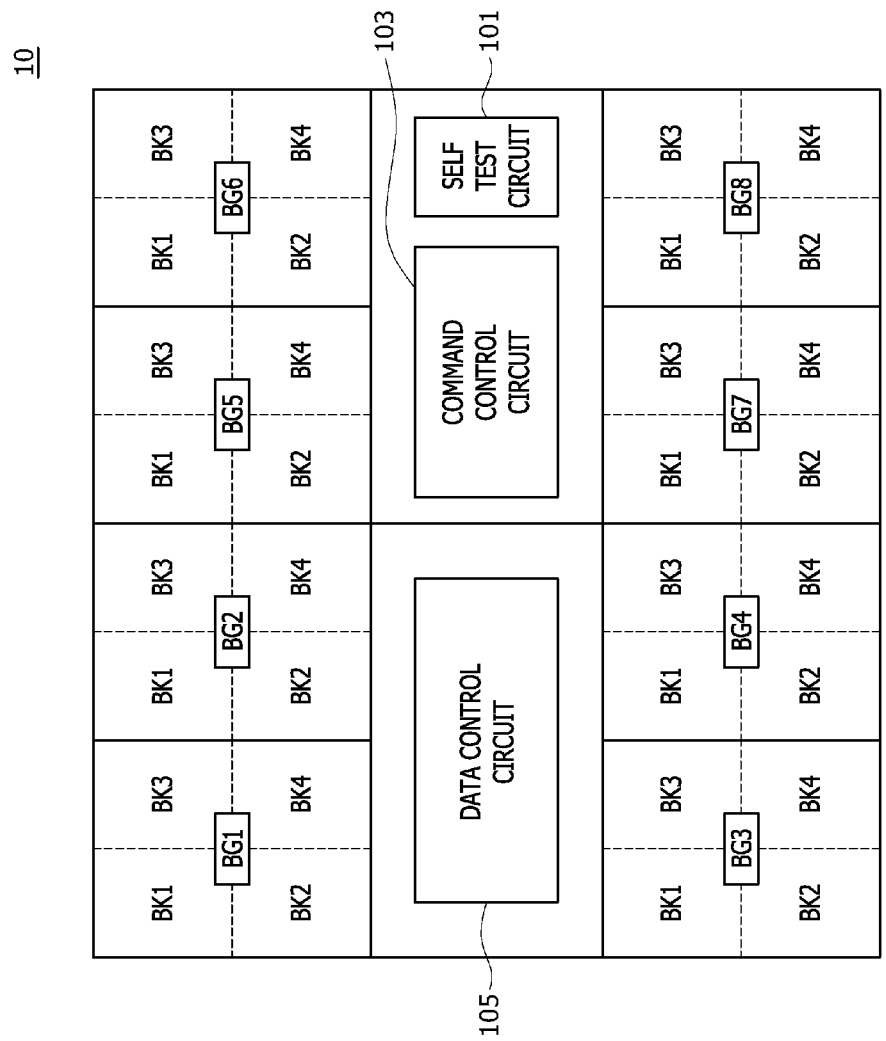
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As shown in FIG. 1, the semiconductor device 10 may include first to eighth bank groups BG1-BG8, a self-test circuit 101, a command control circuit 103, and a data control circuit 105.

Each of the first to eighth bank groups BG1-BG8 may include first to fourth banks BK1-BK4. The structures of the first to fourth banks BK1-BK4 and the number of banks included in each of the first to eighth bank groups BG1-BG8 may be variously implemented according to embodiments. The first bank group BG1, the second bank group BG2, the fifth bank group BG5, and the sixth bank group BG6 may be positioned at an upper end portion of the semiconductor device 10, and the third bank group BG3, the fourth bank group BG4, the seventh bank group BG7, and the eighth bank group BG8 may be positioned at a lower end portion of the semiconductor device 10, but it is only an example and is not limited thereto.

The self-test circuit 101 may be positioned between the fifth and sixth bank groups BG5-BG6 and the seventh and eighth bank groups BG7-BG8. The self-test circuit 101 may generate an internal clock (ICLK in FIG. 2) having a higher frequency than a clock (CLK in FIG. 2) that is applied from an external device (31 in FIG. 17), may generate an instruction signal (INST in FIG. 2) from a pre-instruction signal (INST_P in FIG. 5) that is extracted through a data line (DL in FIG. 2), and may generate an internal control signal (ICA in FIG. 2) from the instruction signal (INST in FIG. 2). The self-test circuit 101 may apply the internal clock (ICLK in FIG. 2) and the internal control signal (ICA in FIG. 2) to the command control circuit 103 to perform a self-test. The self-test may be performed to determine whether a defect has occurred in the memory cells included in the first to eighth bank groups BG1-BG8.

Figure 21:
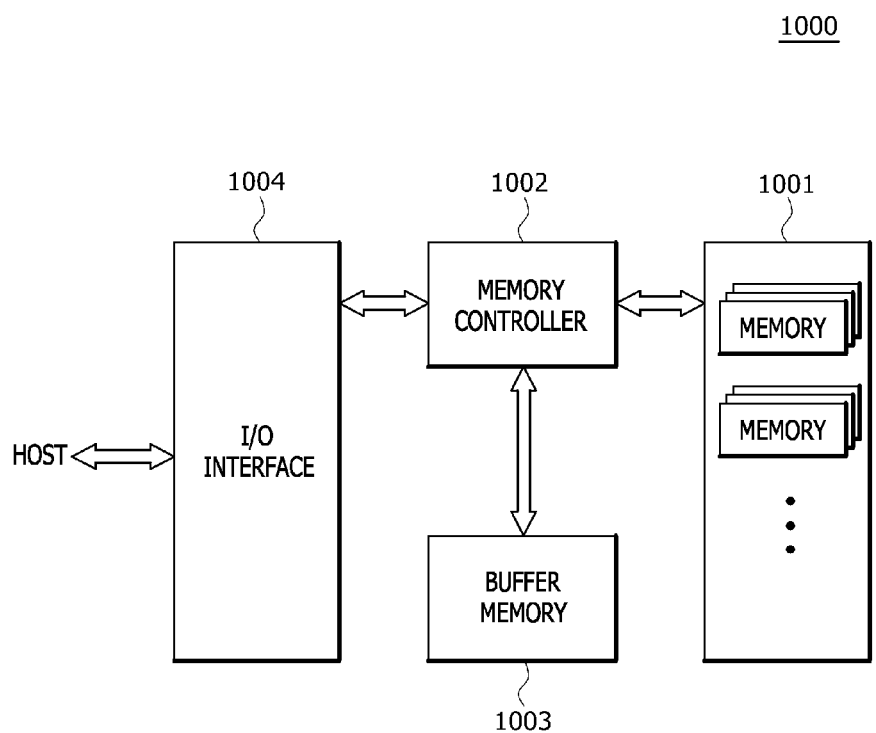
FIG. 21 is a block diagram illustrating a configuration of a semiconductor system according to an embodiment of the present disclosure.

The command control circuit 103 may be positioned between the fifth and sixth bank groups BG5-BG6 and the seventh and eighth bank groups BG7-BG8. The command control circuit 103 may generate test commands (TRD_CMD and TWT_CMD in FIG. 2), based on the internal clock (ICLK in FIG. 2) and the internal control signal (ICA in FIG. 2) that are received from the self-test circuit 101. The command control circuit 103 may apply the test commands (TRD_CMD and TWT_CMD in FIG. 2) to the data control circuit 105 to perform the self-test to determine whether a defect has occurred in the memory cells included in the first to eighth bank groups BG1-BG8. The command control circuit 103 may generate normal commands (RD_CMD and WT_CMD in FIG. 2), based on the clock (CLK in FIG. 2) and the control signal (CA in FIG. 2) that are received from the external device (31 in FIG. 17). The external device (31 in FIG. 17) may include a test device (not shown) and a controller (1002 of FIG. 21, 1300 in FIG. 22). The command control circuit 103 may apply the normal commands (RD_CMD and WT_CMD in FIG. 2) to the data control circuit 105 to perform a normal operation on the first to eighth bank groups BG1-BG8. The normal operation may include a read operation of outputting data stored in the memory cells included in the first to eighth bank groups BG1-BG8 and a write operation of storing data in the memory cells included in the first to eighth bank groups BG1-BG8.

The data control circuit 105 may be positioned between the first and second bank groups BG1-BG2 and the third and fourth bank groups BG3-BG4. The data control circuit 105 may perform a self-test based on the test commands (TRD_CMD and TWT_CMD in FIG. 2) that are received from the command control circuit 103. In the self-test, the data control circuit 105 may store data that is output from some of the memory cells included in the first to eighth bank groups BG1-BG8 in other memory cells among the memory cells included in the first to eighth bank groups BG1-BG8. The data control circuit 105 may perform a read operation of outputting data stored in selected memory cells among the memory cells included in the first to eighth bank groups BG1-BG8 and a write operation of storing data that is input to a data pad (135 in FIG. 2) in selected memory cells among the memory cells included in the first to eighth bank groups BG1-BG8, based on the normal commands (RD_CMD and WT_CMD in FIG. 2) that are received from the command control circuit 103.

Figure 2:
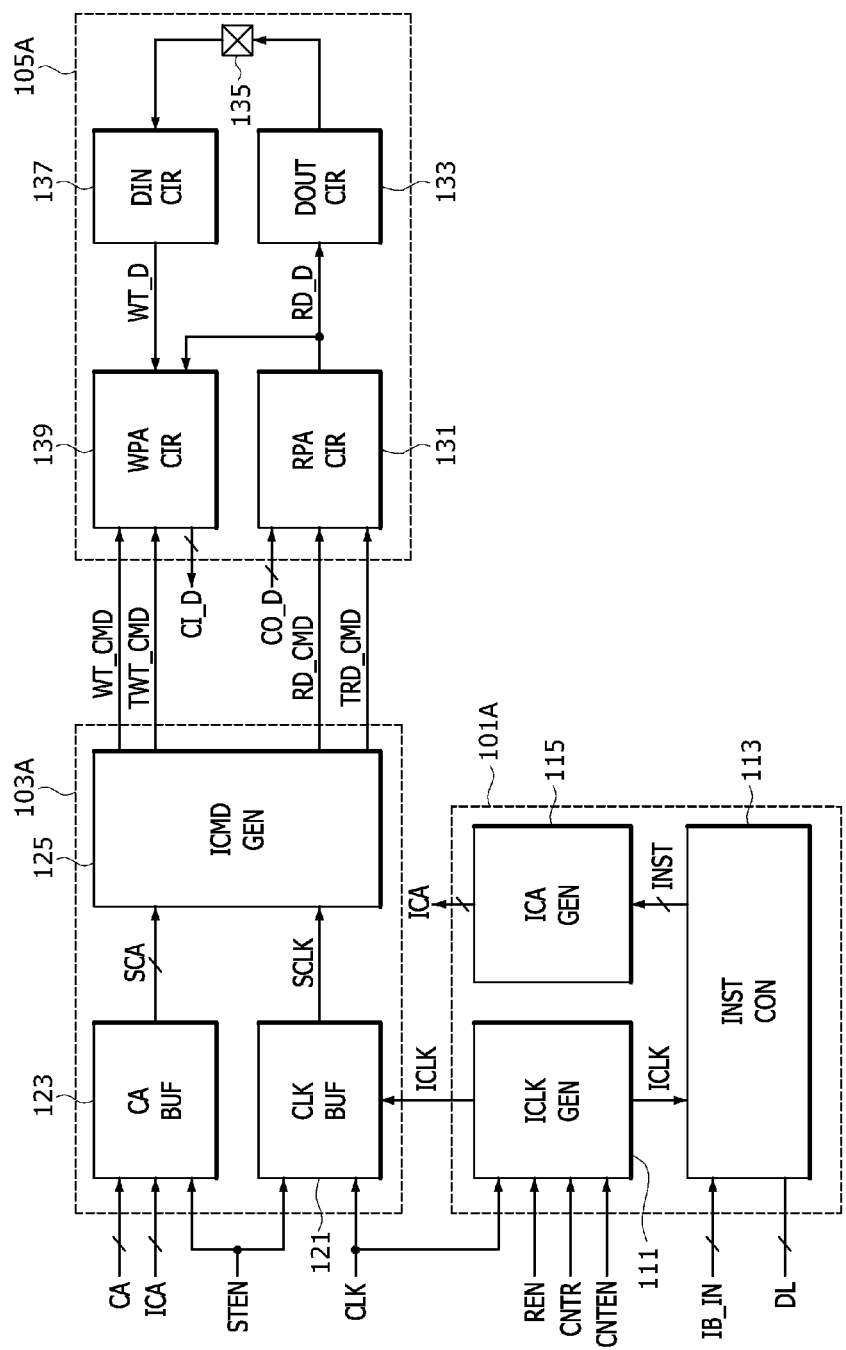
FIG. 2 is a block diagram illustrating configurations according to examples of a self-test circuit, a command control circuit, and a data control circuit included in the semiconductor device shown in FIG. 1.

FIG. 2 is a block diagram illustrating configurations of a self-test circuit 101A, a command control circuit 103A, and a data control circuit 105A according to examples of the self-test circuit 101, the command control circuit 103, and the data control circuit 105 shown in FIG. 1, respectively.

As shown in FIG. 2, the self-test circuit 101A may include an internal clock generating circuit (ICLK GEN) 111, an instruction signal control circuit (INST CON) 113, and an internal control signal generating circuit (ICA GEN) 115.

The internal clock generating circuit 111 may generate an internal clock ICLK, based on an oscillating enable signal REN, a counter reset signal CNTR, a counter enable signal CNTEN, and a clock CLK. The internal clock generating circuit 111 may generate an internal clock ICLK that is set to an initialized frequency, based on the oscillating enable signal REN. The internal clock generating circuit 111 may initialize a counting operation on the clock CLK and the internal clock ICLK, based on the counter reset signal CNTR. The internal clock generating circuit 111 may count the clock CLK a preset number of times based on the counter enable signal CNTEN, and then, may calibrate a frequency of the internal clock ICLK, based on the result of counting the clock CLK. The oscillating enable signal REN, the counter reset signal CNTR, and the counter enable signal CNTEN may be signals stored in a mode register (331 in FIG. 17) or a test mode circuit (333 in FIG. 17), and may be generated for the operation of generating the frequency-calibrated internal clock ICLK. The internal clock generating circuit 111 may be connected to the instruction signal control circuit 113 and a clock buffer circuit 121 to apply the internal clock ICLK to the instruction signal control circuit 113 and the clock buffer circuit 121.

The instruction signal control circuit 113 may store a pre-instruction signal (INST_P in FIG. 5) that is extracted through a data line DL, and may generate an instruction signal INST from the stored pre-instruction signal (INST_P in FIG. 5), based on the internal clock ILCK that is received from the internal clock generating circuit 111 and a buffer input signal IB_IN. The buffer input signal IB_IN may be a signal stored in the mode register (331 in FIG. 17) or the test mode circuit (333 in FIG. 17), and may be activated to extracted the pre-instruction signal (INST_P of FIG. 5) for generating the instruction signal INST from the data line DL. The instruction signal control circuit 113 may be connected to the internal control signal generating circuit 115 to apply the instruction signal INST to the internal control signal generating circuit 115.

The internal control signal generating circuit 115 may generate an internal control signal ICA including an instruction test command (TCMD in FIG. 14) and instruction test information (TIF in FIG. 14) for a self-test, based on the instruction signal INST that is received from the instruction signal control circuit 113. The internal control signal generating circuit 115 may generate an internal control signal ICA including an instruction normal command (NCMD in FIG. 14) and information (BG/BK, ADD in FIG. 14) on an instruction address for a test normal operation based on the instruction signal INST.

As shown in FIG. 2, the command control circuit 103A may include the clock buffer circuit (CLK BUF) 121, a control signal buffer circuit (CA BUF) 123, and an internal command generating circuit (ICMD GEN) 125.

The clock buffer circuit 121 may be connected to the internal clock generating circuit 111 to receive the internal clock ILCK from the internal clock generating circuit 111. The clock buffer circuit 121 may output one of the clock CLK and the internal clock ICLK as a selection clock SCLK based on a self-test signal STEN. The self-test signal STEN may be a signal stored in the mode register (331 in FIG. 17) or the test mode circuit (333 in FIG. 17), and may be activated to perform a self-test operation. The clock CLK may be applied from an external device (31 of FIG. 17). The clock buffer circuit 121 may be connected to the internal command generating circuit 125 to apply the selection clock SCLK to the internal command generating circuit 125.

The control signal buffer circuit 123 may be connected to the internal control signal generating circuit 115 to receive the internal control signal ICA from the internal control signal generating circuit 115. The control signal buffer circuit 123 may output one of the control signal CA and the internal control signal ICA as the selection control signal SCA based on the self-test signal STEN. The control signal buffer circuit 123 may be connected to the internal command generating circuit 125 to apply the selection control signal SCA to the internal command generating circuit 125.

The internal command generating circuit 125 may be connected to the clock buffer circuit 121 and the control signal buffer circuit 123 to receive the selection clock SCLK from the clock buffer circuit 121 and to receive the selection control signal SCA from the control signal buffer circuit 123. The internal command generating circuit 125 may generate a write command WT_CMD, a test write command TWT_CMD, a read command RD_CMD, and a test read command TRD_CMD based on the selection clock SCLK and the selection control signal SCA. The internal command generating circuit 125 may generate the test read command TRD_CMD for a test read operation of outputting data stored in some memory cells (not shown) in the self-test. The internal command generating circuit 125 may generate the test write command TWT_CMD for a test write operation of storing data output from the test read operation in memory cells (not shown) on which the test read operation is not performed in the self-test. The internal command generating circuit 125 may generate the read command RD_CMD for a read operation of outputting data stored in memory cells (not shown) selected in a normal operation. The internal command generating circuit 125 may generate the write command WT_CMD for a write operation of storing data in the memory cells (not shown) selected in the normal operation. The internal command generating circuit 125 may be connected to a write path circuit 139 and a read path circuit 131 to apply the write command WT_CMD and the teat write command TWT_CMD to the write path circuit 139 and to apply the read command RD_CMD and the test read command TRD_CMD to the read path circuit 131.

As shown in FIG. 2, the data control circuit 105A may include the read path circuit (RPA CIR) 131, a data output circuit (DOUT CIR) 133, a data pad 135, a data input circuit (DIN CIR) 137, and the write path circuit (WPA CIR) 139.

The read path circuit 131 may be connected to the internal command generating circuit 125 to receive the read command RD_CMD and the test read command TRD_CMD from the internal command generating circuit 125. The read path circuit 131 may perform a test read operation or a read operation based on the test read command TRD_CMD or the read command RD_CMD. The read path circuit 131 may perform a test read operation of outputting cell output data CO_D stored in some memory cells (not shown) as read data RD_D based on the test read command TRD_CMD. The read path circuit 131 may apply the read data RD_D to the write path circuit 139 when the test read operation is performed. The read path circuit 131 may perform a read operation of outputting the cell output data CO_D stored in the selected memory cells (not shown) as the read data RD_D based on the read command RD_CMD. The read path circuit 131 may apply the read data RD_D to the data output circuit 133 when the read operation is performed.

The data output circuit 133 may be connected to the read path circuit 131 to receive the read data RD_D from the read path circuit 131. The data output circuit 133 may output the received read data RD_D to the data pad 135 when the read operation is performed.

The data input circuit 137 may be connected to the write path circuit 139 to apply write data WT_D that is received through the data pad 135 to the write path circuit 139 when a write operation is performed.

The write path circuit 139 may be connected to the internal command generating circuit 125 to receive the write command WT_CMD and the test write command TWT_CMD from the internal command generating circuit 125. The write path circuit 139 may perform a test write operation or a write operation based on the test write command TWT_CMD and the write command WT_CMD. The write path circuit 139 may perform a write operation of storing the read data RD_D output from the read path circuit 131 as cell input data CI_D in the memory cell (not shown) in a portion where the test read operation is not performed based on the test write command TWT_CMD. The write path circuit 139 may perform a write operation of storing the write data WT_D received through the data input circuit 137 as the cell input data CI_D in selected memory cells (not shown) based on the write command WT_CMD.

Figure 3:
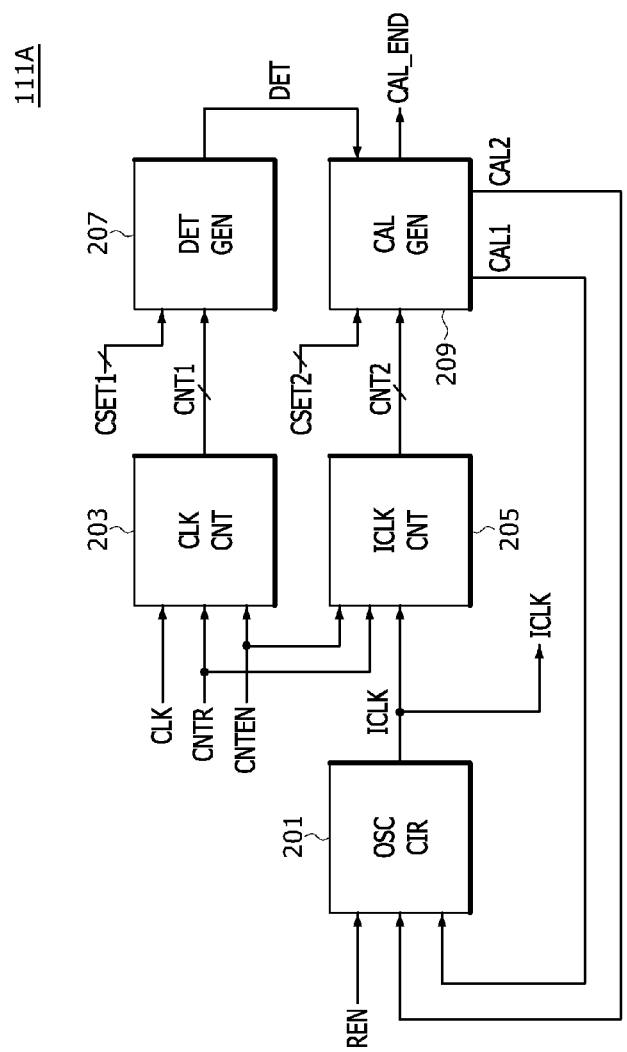
FIG. 3 is a block diagram illustrating a configuration according to an example of an internal clock generating circuit included in the semiconductor device shown in FIG. 2.

FIG. 3 is a block diagram illustrating a configuration of an internal clock generating circuit 111A according to an example of the internal clock generating circuit 111 shown in FIG. 2. As shown in FIG. 3, the internal clock generating circuit 111A may include an oscillating circuit (OSC CIR) 201, a clock counter (CLK CNT) 203, an internal clock counter (ICLK CNT) 205, a detection signal generating circuit (DET GEN) 207, and a calibration signal generating circuit (CAL GEN) 209.

The oscillating circuit 201 may generate an internal clock ICLK set to an initialized frequency based on an oscillating enable signal REN. The oscillating circuit 201 may receive a first calibration signal CAL1 and a second calibration signal CAL2 from the calibration signal generating circuit 209. The oscillating circuit 201 may calibrate a frequency of the internal clock ICLK based on the first calibration signal CAL1 and the second calibration signal CAL2. As an example, the oscillating circuit 201 may receive the first calibration signal CAL1 that is activated when a frequency of the internal clock ICLK is higher than a preset setting value to calibrate the frequency of the internal clock ICLK to be slower. As another example, the oscillating circuit 201 may receive the second calibration signal CAL2 that is activated when the frequency of the internal clock ICLK is lower than the preset setting value to calibrate the frequency of the internal clock ICLK to be faster. The oscillating circuit 201 may be connected to the internal clock counter 205 to apply the internal clock ICLK to the internal clock counter 205.

The clock counter 203 may count the clock received from an external device (31 in FIG. 17) to generate a first counting signal CNT1 based on a counter reset signal CNTR and a counter enable signal CNTEN. The clock counter 203 may initialize the first counting signal CNT1 when the counter reset signal CNTR is activated. For example, the clock counter 203 may initialize all bits included in the first counting signal CNT1 to a logic "low" level when the counter reset signal CNTR is activated. The clock counter 203 may count the clock CLK to generate the first counting signal CNT1 in which a logic bit set is variable when the counter enable signal CNTEN is activated. For example, when the first counting signal CNT1 includes 3 bits and is set to '000', the clock counter 203 may generate the first counting signal CNT1 in which the logic bit set is sequentially and repeatedly changed from '000' to '111' whenever the clock CLK is counted. The fact that the first counting signal CNT1 has a logic bit set that is set to '000' may mean that all of the logic bit sets of the bits included in the first counting signal CNT1 are at a logic "low" level, and the fact that the first counting signal CNT1 has a logic bit set that is set to '111' may mean that all logic bit sets of the bits included in the first counting signal CNT1 have a logic "high" level. Counting the clock CLK may mean counting the number of times the clock CLK transitions to a specific logic level or the number of times the clock CLK toggles. The counter enable signal CNTEN may be set to be activated after the counter reset signal CNTR is activated. The counter reset signal CNTR and the counter enable signal CNTEN may be stored in the mode register (331 in FIG. 17) by a mode register set operation or may be stored in the test mode circuit (333 in FIG. 17) by a test mode operation. The clock counter 203 may be connected to the detection signal generating circuit 207 to apply the first counting signal CNT1 to the detection signal generating circuit 207.

The internal clock counter 205 may be connected to the oscillating circuit 201 to receive the internal clock ICLK from the oscillating circuit 201. The internal clock counter 205 may count the internal clock ICLK to generate a second counting signal CNT2 based on the counter reset signal CNTR and the counter enable signal CNTEN. The internal clock counter 205 may initialize the second counting signal CNT2 when the counter reset signal CNTR is activated. For example, the internal clock counter 205 may initialize all bits included in the second counting signal CNT2 to a logic "low" level when the counter reset signal CNTR is activated. The internal clock counter 205 may count the internal clock ICLK to generate the second counting signal CNT2 in which a logic bit set is variable when the counter enable signal CNTEN is activated. For example, when the second counting signal CNT2 includes 3 bits and is set to '000', the internal clock counter 205 may generate the second counting signal CNT2 in which the logic bit set is sequentially and repeatedly changed from '000' to '111' whenever the internal clock ICLK is counted. The internal clock counter 205 may be connected to the calibration signal generating circuit 209 to apply the second counting signal CNT2 to the calibration signal generating circuit 209.

The detection signal generating circuit 207 may be connected to the clock counter 203 to receive the first counting signal CNT1 from the clock counter 203. The detection signal generating circuit 207 may generate a detection signal DET based on the first counting signal CNT1 and a first setting code CSET1. The detection signal generating circuit 207 may generate the detection signal DET that is activated when a logic bit set of the first counting signal CNT1 is the same as a logic bit set of the first setting code CSET1. The first setting code CSET1 may be set to have a logic bit set corresponding to a preset first setting value to be stored in the mode register (331 in FIG. 17) or the test mode circuit (333 in FIG. 17). For example, when the clock CLK is counted 100 times in a state in which the first setting value is set to 100, the detection signal generating circuit 207 may generate an activated detection signal DET. The detection signal generating circuit 207 may be connected to the calibration signal generating circuit 209 to apply the detection signal DET to the calibration signal generating circuit 209.

The calibration signal generating circuit 209 may generate the first calibration signal CAL1 and the second calibration signal CAL2 based on the detection signal DET, the second counting signal CNT2, and a second setting code CSET2. The calibration signal generating circuit 209 may compare the second counting signal CNT2 and the second setting code CSET2 to generate the first calibration signal CAL1 and the second calibration signal CAL2 when the detection signal DET is activated. The second setting code CSET2 may be set to have a logic bit set corresponding to a preset second setting value to be stored in the mode register (331 in FIG. 17) or the test mode circuit (333 in FIG. 17). The calibration signal generating circuit 209 may generate the first calibration signal CAL1 that is activated when the setting value according to the second counting signal CNT2 is greater than the second setting value by the second setting code CSET2 in a state in which the detection signal DET is activated. For example, in a state in which the clock CLK is counted 100 times and the detection signal DET is activated, when the second setting value is set to 4000 and the internal clock ICLK is counted by 4050 times, the calibration signal generating circuit 209 may generate an activated first calibration signal CAL1. The calibration signal generating circuit 209 may generate the second calibration signal CAL2 that is activated when the setting value according to the second counting signal CNT2 is smaller than the second setting value by the second setting code CSET2 in a state in which the detection signal DET is activated. For example, in a state in which the clock CLK is counted 100 times and the detection signal DET is activated, when the second setting value is set to 4000 and the internal clock ICLK is counted 3950 times, the calibration signal generating circuit 209 may generate an activated second calibration signal CAL2. The calibration signal generating circuit 209 may generate a calibration end signal CAL_END that is activated to terminate the calibration operation when the setting value according to the second counting signal CNT2 is the same as the second setting value by the second setting code CSET2 in a state in which the detection signal DET is activated. The calibration signal generating circuit 209 may be connected to the oscillating circuit 201 to apply the first calibration signal CAL1 and the second calibration signal CAL2 to the oscillating circuit 201.

Figure 4:
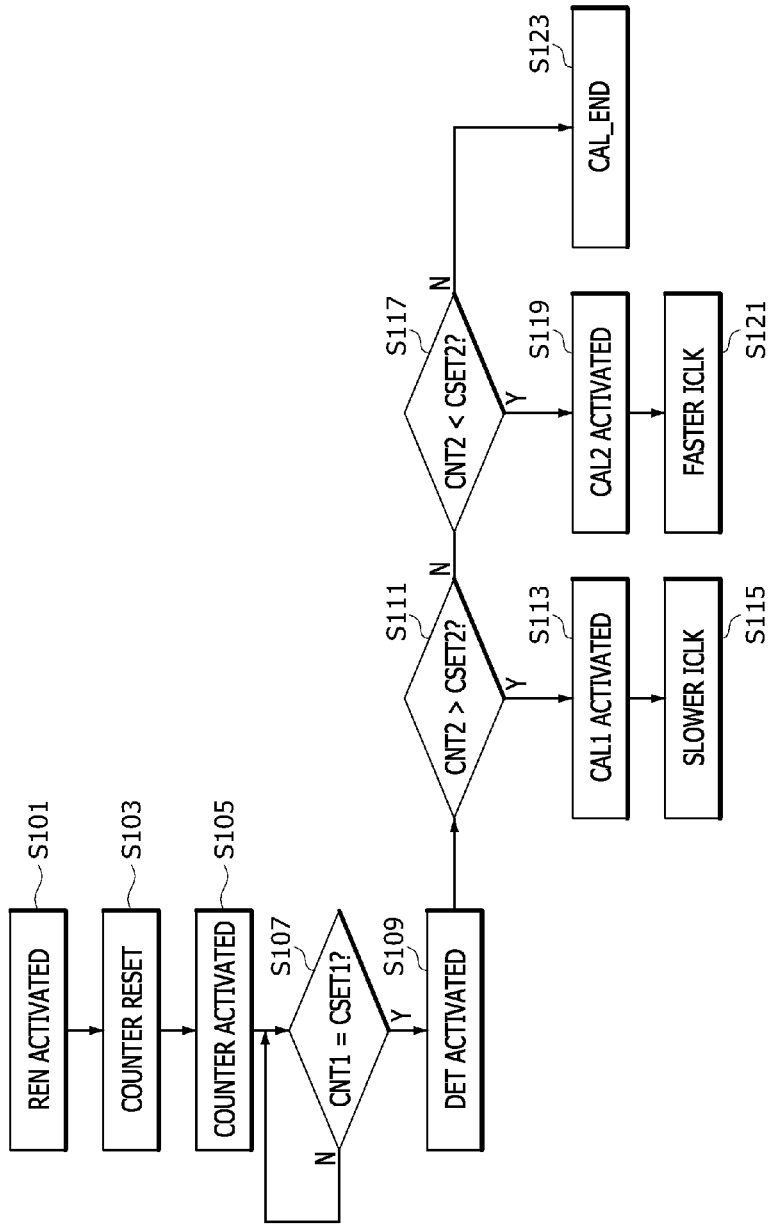
FIG. 4 is a flow chart illustrating an operation of the internal clock generating circuit shown in FIG. 3.

FIG. 4 is a flow chart illustrating an operation of the internal clock generating circuit 111A shown in FIG. 3.

As shown in FIG. 4, when an oscillating enable signal REN is activated, an internal clock ICLK set to an initialized frequency may be generated (S101), when a counter reset signal CNTR is activated, a counting operation for a clock CLK and the internal clock ICLK may be initialized (S103), and when the counter enable signal CNTEN is activated, the counting operation for the clock CLK and the internal clock ICLK may be performed (S105).

As shown in FIG. 4, first, it may be determined whether the number of times the clock CLK is counted is the same as a first setting value that is set by a first setting code CSET1 (S107). When the number of times the clock CLK is counted is not the same as the first setting value that is set by the first setting code CSET1 ('N'), the counting for the internal clock ICLK may be repeatedly performed, and when the number of times the clock CLK is counted is the same as the first setting value that is set by the first setting code CSET1 ('Y'), an activated detection signal DET may be generated (S109). Next, it may be determined whether the number of times the internal clock ICLK is counted is greater than a second setting value that is set by a second setting code CSET2 (S111). When the number of times the internal clock ICLK is counted is greater than the second setting value that is set by the second setting code CSET2 ('Y'), the first calibration signal CAL1 may be activated (S113) and a frequency of the internal clock ICLK may be calibrated to be slower. When the number of times the internal clock ICLK is counted is not greater than the second setting value that is set by the second setting code CSET2 ('N'), it may be determined whether the number of times the internal clock ICLK is counted is smaller than the second setting value that is set by the second setting code CSET2 (S117). Next, when the number of times the internal clock ICLK is counted is smaller than the second setting value that is set by the second setting code CSET2 ('Y'), the second calibration signal CAL2 may be activated (S119), and the frequency of the internal clock ICLK may be calibrated to be faster (S121). When the number of times the internal clock ICLK is counted is not greater than the second setting value that is set by the second setting code CSET2 ('N'), and the number of times the internal clock ICLK is counted is not smaller than the second setting value set by the second setting code CSET2 ('N'), the calibration for the internal clock ICLK may be finished (S123).

In the present embodiment, although the calibration operation for the internal clock ICLK is set to be finished when the number of times the internal clock ICLK is counted is the same as the second setting value that is set by the second setting code CSET2, according to embodiments, the calibration operation for the Internal clock ICLK may be set to be finished when the number of times the internal clock ICLK is counted is included in a setting range that is set by the second setting code CSET2. For example, the setting range that is set by the second setting code CSET2 may be set from a value smaller than the second setting value by a to a value greater than the second setting value by a.

Figure 5:
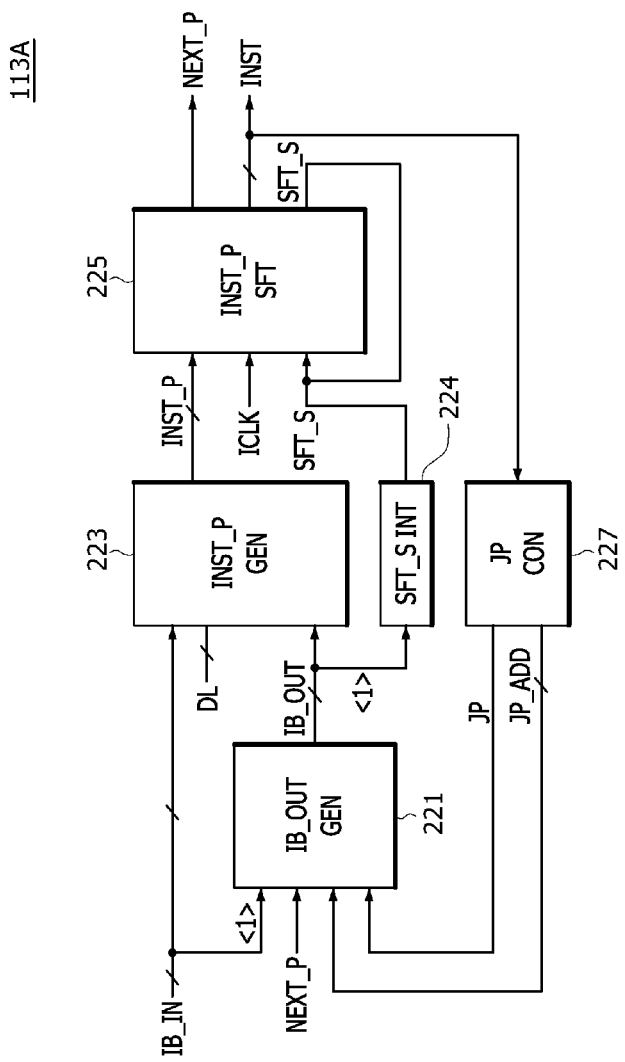
FIG. 5 is a block diagram illustrating a configuration according to an example of an instruction signal control circuit included in the semiconductor device shown in FIG. 2.

FIG. 5 is a block diagram illustrating a configuration of an instruction signal control circuit 113A according to an example of the instruction signal control circuit 113 shown in FIG. 2. As shown in FIG. 5, the instruction signal control circuit 113A may include a buffer output signal generating circuit (IB_OUT GEN) 221, a pre-instruction signal generating circuit (INST_P GEN) 223, a shifting signal initializing circuit (SFT_S INT) 224, a pre-instruction signal shifting circuit (INST_P SFT) 225, and a switching control circuit (JP CNT) 227.

The buffer output signal generating circuit 221 may be connected to the pre-instruction signal shifting circuit 225 and the switching control circuit 227 to receive a counting pulse NEXT_P from the pre-instruction signal shifting circuit 225 and to receive a switching signal JP and a switching address JP_ADD from the switching control circuit 227. The buffer output signal generating circuit 221 may generate a buffer output signal IB_OUT based on a first bit IB_IN<1> of a buffer input signal IB_IN, the counting pulse NEXT_P, the switching signal JP, and the switching address JP_ADD. The buffer input signal IB_IN may be a signal stored in a mode register (331 in FIG. 17) or a test mode circuit (333 in FIG. 17), and may be activated to extracted a pre-instruction signal INST_P for generating an instruction signal INST from a data line DL. The buffer input signal IB_IN may include a plurality of bits, and each of the bits included in the buffer input signal IB_IN may correspond to one of a plurality of pre-instruction signal buffers (241_1-241_L in FIG. 8). For example, the buffer output signal generating circuit 221 may activate the first bit IB_OUT<1> of the buffer output signal IB_OUT when the first bit IB_IN<1> of the buffer input signal IB_IN is activated, and may sequentially activate the remaining bits of the buffer output signal IB_OUT from a second bit IB_OUT<2> of the buffer output signal IB_OUT whenever the counting pulse NEXT_P is generated. The buffer output signal generating circuit 221 may generate the buffer output signal IB_OUT so that the pre-instruction signal INST_P is output from a pre-instruction signal buffer corresponding to the switch address JP_ADD among the plurality of pre-instruction signal buffers (241_1 to 241_L in FIG. 8) when the switching signal JP and the switching address JP_ADD are generated from the instruction signal INST. The buffer output signal generating circuit 221 may be connected to the pre-instruction signal generating circuit 223 and the shifting signal initializing circuit 224 to apply the buffer output signal IB_OUT to the pre-instruction signal generating circuit 223 and the shifting signal initializing circuit 224.

The pre-instruction signal generating circuit 223 may store the pre-instruction signal INST_P that is extracted through the data line DL or may output the stored pre-instruction signal INST_P based on the buffer input signal IB_IN and the buffer output signal IB_OUT. More specifically, the pre-instruction signal generating circuit 223 may extract and store the pre-instruction signal INST_P that is received through the data line DL based on the buffer input signal IB_IN, and may output the stored pre-instruction signal INST_P based on the buffer output signal IB_OUT. The pre-instruction signal generating circuit 223 may include the plurality of pre-instruction signal buffers (241_1-241_L in FIG. 8). Each of the plurality of pre-instruction signal buffers (241_1-241_L in FIG. 8) may store and output the pre-instruction signal INST_P when the corresponding buffer input signal IB_IN and buffer output signal IB_OUT are activated. For example, when the K$^{th}$ bit IB_IN<K> of the buffer input signal IB_IN is activated, the pre-instruction signal INSTP may be stored in the pre-instruction signal buffer 241_K, and when the K$^{th}$ bit IB_OUT<K> of the buffer output signal IB_OUT is activated, the pre-instruction signal INST_P stored in the pre-instruction signal buffer 241_K may be output. The pre-instruction signal generating circuit 223 may be connected to the pre-instruction signal shifting circuit 225 to apply the pre-instruction signal INST_P to the pre-instruction signal shifting circuit 225.

The shifting signal initializing circuit 224 may initialize a shifting signal SFT_S based on the buffer output signal IB_OUT. More specifically, the shifting signal initializing circuit 224 may generate the shifting signal SFT_S that is activated when the first bit IB_OUT<1> of the buffer output signal IB_OUT is activated. The shifting signal initializing circuit 224 may activate the shifting signal SFT_S so that the pre-instruction signal INST_P is shifted in the pre-instruction signal shifting circuit 225 when the first bit IB_OUT<1> of the buffer output signal IB_OUT is activated and the pre-instruction signal INST_P stored in the pre-instruction signal buffer (241_1 in FIG. 8) among the plurality of pre-instruction signal buffers (241_1 to 241_L in FIG. 8) is output.

The pre-instruction signal shifting circuit 225 may generate the counting pulse NEXT_P, the instruction signal INST, and the shifting signal SFT_S based on the pre-instruction signal INST_P, an internal clock ICLK, and the shifting signal SFT_S. More specifically, the pre-instruction signal shifting circuit 225 may generate the instruction signal INST by shifting the pre-instruction signal INST_P in synchronization with the internal clock ICLK based on the shifting signal SFT_S. The pre-instruction signal shifting circuit 225 may shift one of a power voltage (VDD in FIG. 11) and a ground voltage (VSS in FIG. 11) in synchronization with the internal clock ICLK to generate the counting pulse NEXT_P and the shifting signal SFT_S based on the shifting signal SFT_S. The pre-instruction signal shifting circuit 225 may deactivate the shifting signal SFT_S after the shifting signal SFT_S is activated and the pre-instruction signal INST_P is received. The pre-instruction signal shifting circuit 225 may synchronize with the internal clock ICLK from a time point when the shifting signal SFT_S is deactivated, and after a preset period has elapsed, may sequentially activate the counting pulse NEXT_P and the shifting signal SFT_S. For example, the pre-instruction signal shifting circuit 225 may activate the counting pulse NEXT_P at a time point when three cycle periods of the Internal clock ICLK have elapsed from the time point when the shifting signal SFT_S is deactivated, and may activate the shifting signal SFT_S at a time point when one cycle interval of the internal clock ICLK has elapsed from the time point when the counting pulse NEXT_P is activated. The pre-instruction signal shifting circuit 225 may be connected to the switching control circuit 227 to apply the instruction signal INST to the switching control circuit 227.

The switching control circuit 227 may generate the switching signal JP and the switching address JP_ADD based on the instruction signal INST. The switching control circuit 227 may decode the instruction signal INST to extract and output the switching signal JP and the switching address JP_ADD. The switching control circuit 227 may decode an instruction test command (TCMD in FIG. 12) included in the instruction signal INST to generate the switching signal JP, and may decode instruction test information (TIF in FIG. 12) included in the Instruction signal INST to generate the switching address JP_ADD.

Figure 6:
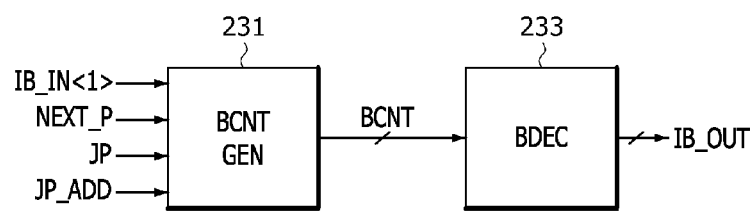
FIG. 6 is a block diagram illustrating a configuration according to an example of a buffer output signal generating circuit included in the instruction signal control circuit shown in FIG. 5.

FIG. 6 is a block diagram illustrating a configuration of a buffer output signal generating circuit 221A according to an example of the buffer output signal generating circuit 221 shown in FIG. 5. As shown in FIG. 6, the buffer output signal generating circuit 221A may include a buffer counting signal generating circuit (BCNT GEN) 231 and a buffer decoder (BDEC) 233.

The buffer counting signal generating circuit 231 may generate a buffer counting signal BCNT, based on a first bit IB_IN<1> of a buffer input signal IB_IN, a counting pulse NEXT_P, a switching signal JP, and a switching address JP_ADD. The buffer counting signal generating circuit 231 may generate the buffer counting signal BCNT having an initialized logic bit set when the first bit IB_IN<1> of the buffer input signal IB_IN is activated. The buffer counting signal generating circuit 231 may count the counting pulse NEXT_P to generate a buffer counting signal BCNT having a variable logic bit set. For example, the buffer counting signal generating circuit 231 may generate a buffer counting signal BCNT in which the logic bit set is set to increase by 1 bit whenever the counting pulse NEXT_P is generated. The buffer counting signal generating circuit 231 may generate the buffer counting signal BCNT having a logic bit set that is set based on the switching signal JP and the switching address JP_ADD. More specifically, the buffer counting signal generating circuit 231 may generate the buffer counting signal BCNT having a logic bit set corresponding to the switching address JP_ADD when the switching signal JP is activated. The number of bits of the switching address JP_ADD and the logic bit set of the buffer counting signal BCNT corresponding to the switching address JP_ADD may be set in various ways according to embodiments. The buffer counting signal generating circuit 231 may be connected to the buffer decoder 233 to apply the buffer counting signal BCNT to the buffer decoder 233.

The buffer decoder 233 may generate the buffer output signal IB_OUT based on the buffer counting signal BCNT. The buffer decoder 233 may decode the buffer counting signal BCNT to generate the buffer output signal IB_OUT so that the pre-instruction signal INST_P is output from the pre-instruction signal buffer corresponding to the logic bit set of the buffer counting signal BCNT among the plurality of pre-instruction signal buffers (241_1-241_L in FIG. 8).

Figure 7:
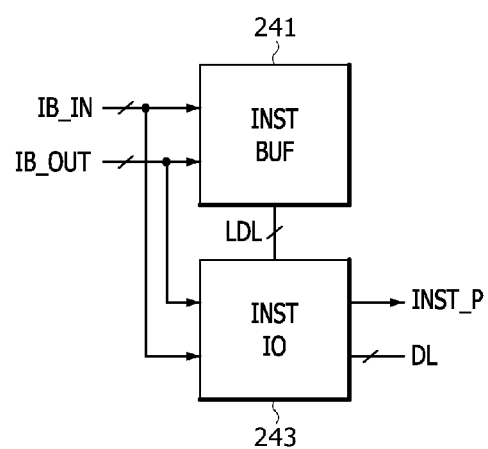
FIG. 7 is a block diagram illustrating a configuration according to an example of a pre-instruction signal generating circuit included in the instruction signal control circuit shown in FIG. 5.

FIG. 7 is a block diagram illustrating a configuration of a pre-instruction signal generating circuit 223A according to an example of the pre-instruction signal generating circuit 223 shown in FIG. 5. As shown in FIG. 7, the pre-instruction signal generating circuit 223A may include a pre-instruction signal buffer circuit (INST BUF) 241 and a pre-instruction signal input/output circuit (INST IO) 243.

The pre-instruction signal buffer circuit 241 may store a pre-instruction signal INST_P that is received through a local data line LDL or may output pre-instruction signal INST_P to the local data line LDL based on a buffer input signal IB_IN and a buffer output signal IB_OUT. More specifically, the pre-instruction signal buffer circuit 241 may receive and store the pre-instruction signal INST_P received through the local data line LDL based on the buffer input signal IB_IN, and may output the stored pre-instruction signal INST_P to the local data line LDL based on the buffer output signal IB_OUT.

The pre-instruction signal input/output circuit 243 may be connected to the pre-instruction signal buffer circuit 241 through the local data line LDL. The pre-instruction signal input/output circuit 243 may transmit the pre-instruction signal INST_P that is extracted through the data line DL to the local data line LDL or may output the pre-instruction signal INST_P that is received through the local data line LDL based on the buffer input signal IB_IN and the buffer output signal IB_OUT. More specifically, the pre-instruction signal input/output circuit 243 may transmit the pre-instruction signal INST_P that is extracted through the data line DL to the local data line LDL based on the buffer input signal IB_IN, and may output the pre-instruction signal INST_P that is received through the local data line LDL based on the buffer output signal IB_OUT.

Figure 8:
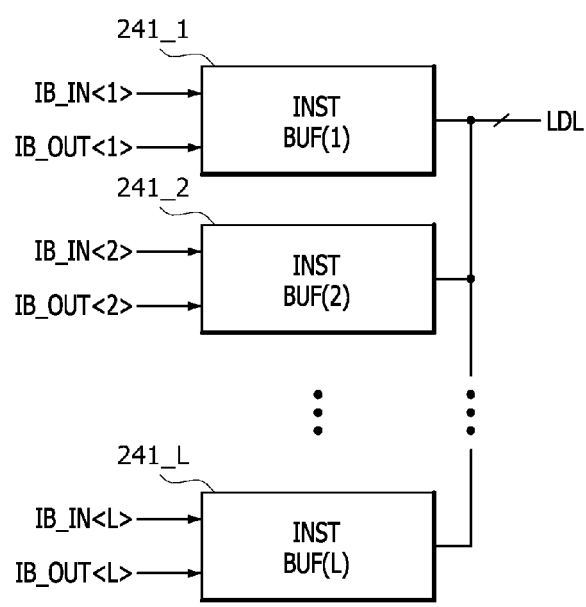
FIG. 8 is a block diagram illustrating a configuration according to an example of a pre-instruction signal buffer circuit included in the pre-instruction signal generating circuit shown in FIG. 7.

FIG. 8 is a block diagram illustrating a configuration of a pre-instruction signal buffer circuit 241A according to an example of the pre-instruction signal buffer circuit 241 shown in FIG. 7. As shown in FIG. 8, the pre-instruction signal buffer circuit 241A may include first to Lt pre-instruction signal buffers 241_1, and 241_2-241_L.

The first pre-instruction signal buffer 2411 may store a pre-instruction signal INST_P that is received through a local data line LDL, or may output stored pre-instruction signal INST_P to the local data line LDL based on a first bit IB_IN<1> of a buffer input signal IB_IN and a first bit IB_OUT<1> of a buffer output signal IB_OUT. More specifically, the first pre-instruction signal buffer 2411 may store the pre-instruction signal INST_P that is received through the local data line LDL when the first bit IB_IN<1> of the buffer input signal IB_IN is activated, and may output stored pre-instruction signal INST_P to the local data line LDL when the first bit IB_OUT<1> of the buffer output signal IB_OUT is activated.

The second pre-instruction signal buffer 241_2 may store the pre-instruction signal INST_P that is received through the local data line LDL, or may output stored pre-instruction signal INST_P to the local data line LDL, based on a second bit IB_IN<2> of the buffer input signal IB_IN and a second bit IB_OUT<2> of the buffer output signal IB_OUT. More specifically, the second pre-instruction signal buffer 241_2 may store the pre-instruction signal INST_P that is received through the local data line LDL when the second bit IB_IN<2> of the buffer input signal IB_IN is activated, and may output the stored pre-instruction signal INST_P to the local data line LDL when the second bit IB_OUT<2> of the buffer output signal IB_OUT is activated.

The $L^{th}$ pre-instruction signal buffer 241_L may store the pre-instruction signal INST_P that is received through the local data line LDL, or may output stored pre-instruction signal INST_P to the local data line LDL, based on a $L^{th}$ bit IB_IN<L> of the buffer input signal IB_IN and a $L^{th}$ bit IB_OUT<L> of the buffer output signal IB_OUT. More specifically, the $L^{th}$ pre-instruction signal buffer 241_L may store the pre-instruction signal INST_P that is received through the local data line LDL when the $L^{th}$ bit IB_IN<L> of the buffer input signal IB_IN is activated, and may output the stored pre-instruction signal INST_P to the local data line LDL when the $L^{th}$ bit IB_OUT<L> of the buffer output signal IB_OUT is activated.

Figure 9:
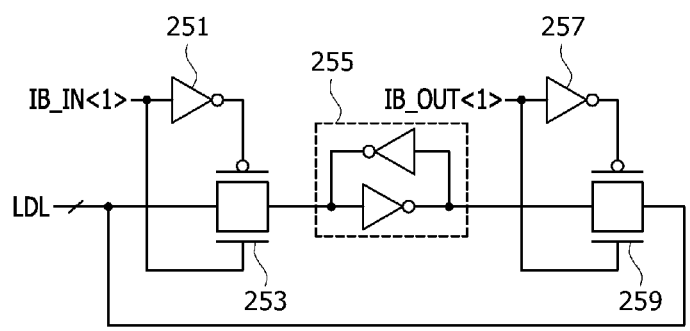
FIG. 9 is a circuit diagram according to an example of a first pre-instruction signal buffer included in the pre-instruction signal buffer circuit shown in FIG. 8.
Figure 10:
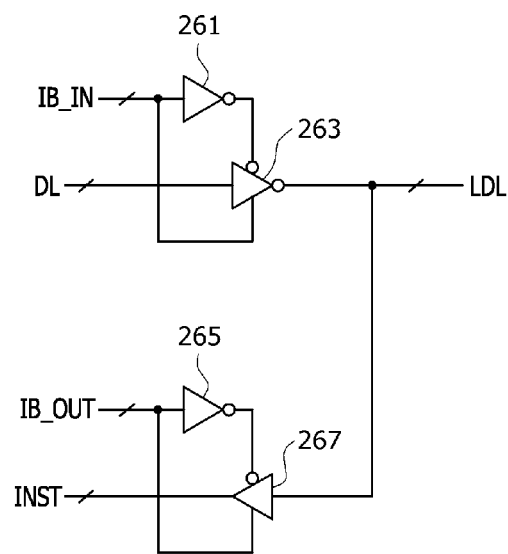
FIG. 10 is a circuit diagram according to an example of a pre-instruction signal input/output circuit included in the pre-instruction signal generating circuit shown in FIG. 7.

FIG. 9 is a circuit diagram of a first pre-instruction signal buffer 241_1A according to an example of the first pre-instruction signal buffer 241_1 shown in FIG. 8. As shown in FIG. 9, the first pre-instruction signal buffer 241_1A may include inverters 251 and 257, transfer gates 253 and 259, and a latch 255. The inverter 251 may inversely buffer a first bit IB_IN<1> of a buffer input signal IB_IN to output an inversely buffered signal of the first bit IB_IN<1> of the buffer input signal IB_IN. The transfer gate 253 may transmit a pre-instruction signal INST_P that is transmitted through a local data line LDL to the latch 255 when the first bit IB_IN<i> of the buffer input signal IB_IN is activated at a logic "high" level. Although the latch 255 is illustrated as a single circuit, the latch 255 may be provided to be connected in parallel to the transfer gate 253 as many as the number of bits included in the pre-instruction signal INST_P. For example, when the pre-instruction signal INST_P includes 64 bits, 64 latches (not shown) for storing the pre-instruction signal INST_P that is transmitted through the local data line LDL may be connected in parallel to the transfer gate 253. The inverter 257 may inversely buffer a first bit IB_OUT<1> of a buffer output signal IB_OUT to output an inversely buffered signal of the first bit IB_OUT<1> of the buffer output signal IB_OUT. The transfer gate 259 may output the pre-instruction signal INST_P that is stored in the latch 255 to the local data line LDL when the first bit IB_OUT<1> of the buffer output signal IB_OUT is activated at a logic "high" level FIG. 10 is a circuit diagram of a pre-instruction signal input/output circuit 243A according to an example of the pre-instruction signal input/output circuit 243 shown in FIG. 7. As shown in FIG. 10, the pre-instruction signal input/output circuit 243A may include inverters 261, 263, 265, and 267. The inverter 261 may inversely buffer a buffer input signal IB_IN to output an inversely buffered signal of the buffer input signal IB_IN. The inverter 263 may inversely buffer a pre-instruction signal INST_P that is extracted through a data line DL when the buffer input signal IB_IN is activated at a logic "high" level to transmit an inversely buffered signal of the pre-instruction signal INST_P to a local data line LDL. The inverter 265 may inversely buffer a buffer output signal IB_OUT to output an inversely buffered signal of the buffer output signal IB_OUT. The inverter 267 may inversely buffer the pre-instruction signal INST_P that is received through the local data line LDL when the buffer output signal IB_OUT is activated at a logic "high" level to transmit an inversely buffered signal of the pre-instruction signal INST_P as an instruction signal INST.

Figure 11:
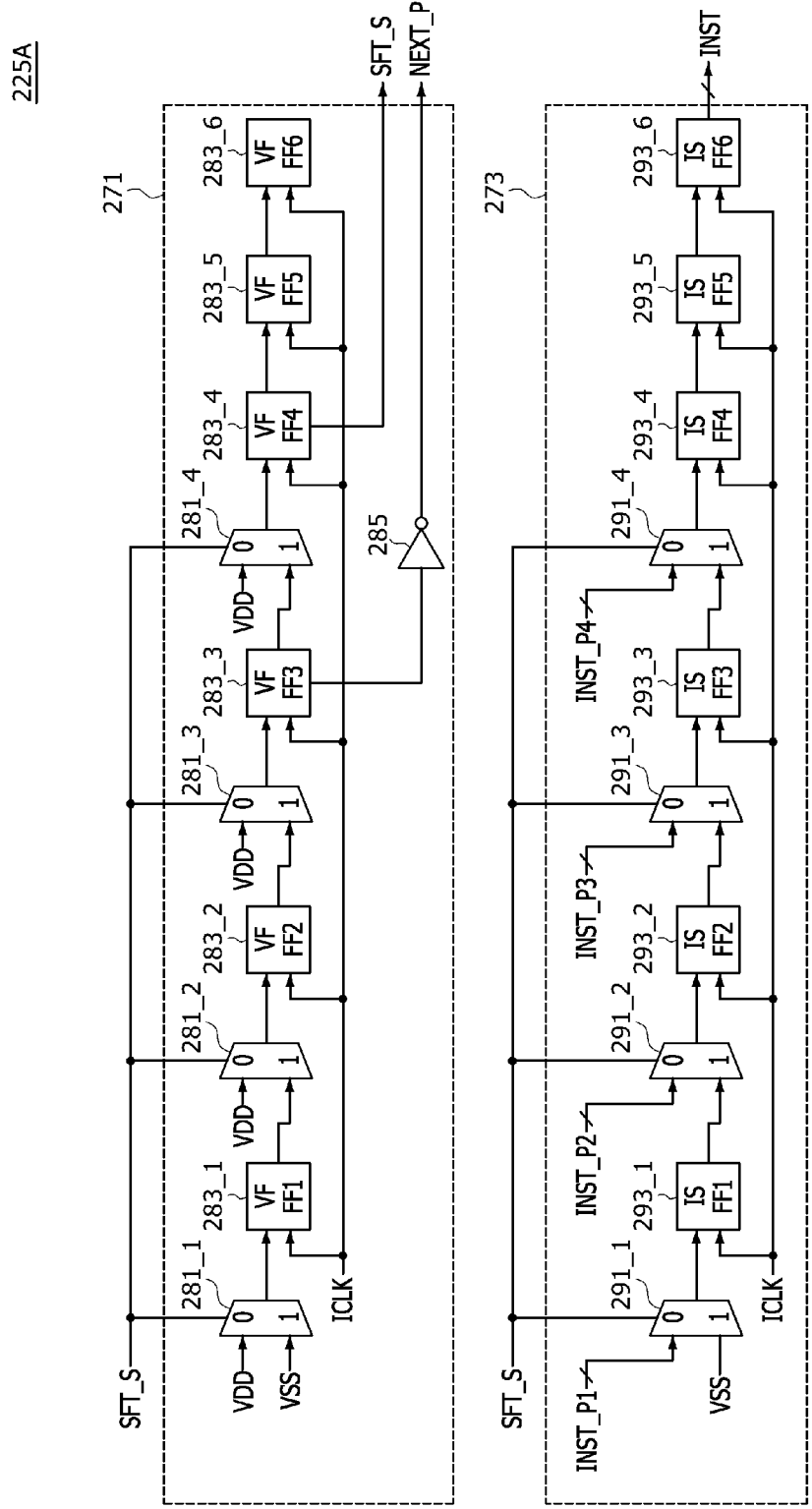
FIG. 11 is a diagram illustrating a configuration according to an example of a pre-instruction signal shifting circuit included in the instruction signal control circuit shown in FIG. 5.

FIG. 11 is a diagram illustrating a configuration of a pre-instruction signal shifting circuit 225A according to an example of the pre-instruction signal shifting circuit 225 shown in FIG. 5. As shown in FIG. 11, the pre-instruction signal shifting circuit 225A may include a first shifting circuit 271 and a second shifting circuit 273.

The first shifting circuit 271 may include first to fourth valid flag selectors 281_1-281_4 and first to sixth valid flag flip-flops 283_1-283_6. The first valid flag selector 281_1 may output one of a power voltage VDD and a ground voltage VSS to the first valid flag flip-flop 283_1 based on a shifting signal SFT_S. The first valid flag flip-flop 283_1 may store an output signal of the first valid flag selector 281_1, and may output stored output signal of the first valid flag selector 281_1 to the second valid flag selector 281_2 based on an internal clock ICLK. The first valid flag flip-flop 283_1 may output the stored output signal of the first valid flag selector 281_1 to the second valid flag selector 281_2 at a time point when one cycle interval of the internal clock ICLK has elapsed from a time point when the output signal of the first valid flag selector 281_1 is stored. The second valid flag selector 281_2 may output one of the power voltage VDD and an output signal of the first valid flag flip-flop 283_1 to the second valid flag flip-flop 283_2 based on the shifting signal SFT_S. The second valid flag flip-flop 283_2 may store the output signal of the second valid flag selector 281_2, and may output the stored output signal of the second valid flag selector 281_2 to the third valid flag selector 281_3 based on the internal clock ICLK. The second valid flag flip-flop 2832 may output the stored output signal of the second valid flag selector 281_2 to the third valid flag selector 281_3 at a time point when one cycle interval of the internal clock ICLK has elapsed from a time point when the output signal of the second valid flag selector 281_2 is stored. The third valid flag selector 2813 may output one of the power supply voltage VDD and the output signal of the second valid flag flip-flop 283_2 to the third valid flag flip-flop 283_3 based on the shifting signal SFT_S. The third valid flag flip-flop 2833 may store an output signal of the third valid flag selector 281_3, and may output the stored output signal of the third valid flag selector 281_3 to the fourth valid flag selector 281_4 based on the internal clock ICLK. The third valid flag flip-flop 2833 may output the stored output signal of the third valid flag selector 281_3 to the fourth valid flag selector 281_4 at a time point when one cycle interval of the internal clock ICLK has elapsed from a time point when the output signal of the third valid flag selector 281_3 is stored. The inverter 285 may inversely buffer an output signal of the third valid flag flip-flop 283_3 to generate a counting pulse NEXT_P. The fourth valid flag selector 281_4 may output one of the power voltage VDD and the output signal of the third valid flag flip-flop 283_3 to the fourth valid flag flip-flop 283_4 based on the shifting signal SFT_S. The fourth valid flag flip-flop 283_4 may store an output signal of the fourth valid flag selector 2814, and may output the stored output signal of the fourth valid flag selector 281_4 to the fifth valid flag flip-flop 283_5 based on the internal clock ICLK. The fourth valid flag flip-flop 2834 may output stored the output signal of the fourth valid flag selector 281_4 to the fifth valid flag flip-flop 283_5 at a time point when one cycle interval of the internal clock ICLK has elapsed from a time point when the output signal of the fourth valid flag selector 281_4 is stored. The fourth valid flag flip-flop 2834 may generate a shifting signal SFT_S from the output signal of the fourth valid flag selector 281_4 based on the Internal clock ICLK. For example, the fourth valid flag flip-flop 2834 may output the output signal of the fourth valid flag selector 281_4 as the shifting signal SFT_S in synchronization with the internal clock ICLK. The fifth valid flag flip-flop 283_5 may store an output signal of the fourth valid flag flip-flop 2834, and may output the stored output signal of the fourth valid flag flip-flop 283_4 to the sixth valid flag flip-flop 283_6. The fifth valid flag flip-flop 283_5 may output the stored output signal of the fourth valid flag flip-flop 283_4 to the sixth valid flag flip-flop 283_6 at a time point when one cycle interval of the internal clock ICLK has elapsed from a time point when the output signal of the fourth valid flag flip-flop 283_4 is stored. The sixth valid flag flip-flop 2836 may store an output signal of the fifth valid flag flip-flop 283_5 based on the internal clock ICLK. The signal stored in the sixth valid flag flip-flop 283_6 may be used as a valid flag for determining whether the instruction signal INST that is generated in the second shifting circuit 273 is effectively generated from the pre-instruction signal INST_P. For example, it may be confirmed that the instruction signal INST generated in the second shifting circuit 273 is a signal effectively generated from the pre-instruction signal INST_P when the signal stored in the sixth valid flag flip-flop 283_6 is at a logic "high" level.

The second shifting circuit 273 may include first to fourth instruction signal selectors 291_1-291_4 and first to sixth instruction signal flip-flops 293_1-293_6. The first instruction signal selector 2911 may output one of a first pre-instruction signal INST_P1 and the ground voltage VSS to the first instruction signal flip-flop 293_1 based on the shifting signal SFT_S. The first instruction signal flip-flop 293_1 may store an output signal of the first instruction signal selector 291_1, and may output the stored output signal of the first instruction signal selector 291_1 to the second instruction signal selector 291_2 based on the internal clock ICLK. The first instruction signal flip-flop 2931 may output the stored output signal of the first instruction signal selector 291_1 to the second instruction signal selector 291_2 at a time point when one cycle interval of the internal clock ICLK has elapsed from a time point when the output signal of the first instruction signal selector 291_1 is stored. The second instruction signal selector 2912 may output one of a second pre-instruction signal INST_P2 and an output signal of the first instruction signal flip-flop 293_1 to the second instruction signal flip-flop 293_2 based on the shifting signal SFT_S. The second instruction signal flip-flop 293_2 may store an output signal of the second instruction signal selector 291_2, and may output the stored output signal of the second instruction signal selector 291_2 to the third instruction signal selector 291_3 based on the internal clock ICLK. The second instruction signal flip-flop 293_2 may output the stored output signal of the second instruction signal selector 291_2 to the third instruction signal selector 291_3 at a time point when one cycle interval of the internal clock ICLK has elapsed from a time point when the output signal of the second instruction signal selector 291_2 is stored. The third instruction signal selector 291_3 may output one of a third pre-instruction signal INST_P3 and an output signal of the second instruction signal flip-flop 2932 to the third instruction signal flip-flop 293_3 based on the shifting signal SFT_S. The third instruction signal flip-flop 293_3 may store an output signal of the third instruction signal selector 291_3, and may output the stored output signal of the third instruction signal selector 291_3 to the fourth instruction signal selector 291_4 based on the internal clock ICLK. The third instruction signal flip-flop 293_3 may output the stored output signal of the third instruction signal selector 291_3 to the fourth instruction signal selector 291_4 at a time point when one cycle interval of the internal clock ICLK has elapsed from a time point when the output signal of the third instruction signal selector 291_3 is stored. The fourth instruction signal selector 291_4 may output one of a fourth pre-instruction signal INST_P4 and an output signal of the third instruction signal flip-flop 2933 to the fourth instruction signal flip-flop 293_4 based on the shifting signal SFT_S. The fourth instruction signal flip-flop 2934 may store an output signal of the fourth instruction signal selector 2914, and may output the stored output signal of the fourth instruction signal selector 291_4 to the fifth instruction signal flip-flop 293_5 based on the internal clock ICLK. The fourth instruction signal flip-flop 2934 may output the stored output signal of the fourth instruction signal selector 291_4 to the fifth instruction signal flip-flop 293_5 at a time point when one cycle interval of the internal clock ICLK has elapsed from a time point when the output signal of the fourth instruction signal selector 291_4 is stored. The fifth instruction signal flip-flop 2935 may store an output signal of the fourth instruction signal flip-flop 293_4, and may output the stored output signal of the fourth instruction signal flip-flop 293_4 to the sixth instruction signal flip-flop 293_6. The fifth instruction signal flip-flop 293_5 may output the stored output signal of the fourth instruction signal flip-flop 293_4 to the sixth instruction signal flip-flop 293_6 at a time point when one cycle interval of the internal clock ICLK has elapsed from a time point when the output signal of the fourth instruction signal flip-flop 293_4 is stored. The sixth instruction signal flip-flop 2936 may store an output signal of the fifth instruction signal flip-flop 293_5 based on the internal clock ICLK.

The first pre-instruction signal INST_P1, the second pre-instruction signal INST_P2, the third pre-instruction signal INST_P3, and the fourth pre-instruction signal INST_P4 may be included in the pre-instruction signal INST_P, and when the pre-instruction signal INST_P is implemented in 64 bits, each of the first pre-instruction signal INST_P1, the second pre-instruction signal INST_P2, the third pre-instruction signal INST_P3, and the fourth pre-instruction signal INST_P4 may be implemented in 16 bits. Each of the first pre-instruction signal INST_P1, the second pre-instruction signal INST_P2, the third pre-instruction signal INST_P3, and the fourth pre-instruction signal INST_P4 may be sequentially output from the second shifting circuit 273 as a 16-bit instruction signal INST.

Because the first shifting circuit 271 stores the power voltage VDD selected by the first to fourth valid flag selectors 281_1-281_4 in the first to fourth valid flag flip-flops 283_1 to 283_4, respectively, when the shifting signal SFT_S is activated at a logic "low" level, the first shifting circuit 271 may generate a counting pulse NEXT_P that is deactivated at a logic "low" level by the output signal of the third valid flag flip-flop 283_3 set to a logic "high" level, and may generate a shifting signal SFT_S that is deactivated at a logic "high" level by the output signal of the fourth valid flag flip-flop 283_4 set to a logic "high" level. The first shifting circuit 271 may shift the ground voltage VSS selected by the first valid flag selector 281_1 in synchronization with the internal clock ICLK when the shifting signal SFT_S is deactivated at a logic "high" level to generate the counting pulse NEXT_P activated at a logic "high" level at a time point when a third cycle interval of the internal clock ICLK elapses after the ground voltage VSS is selected in the first valid flag selector 281_1, and may generate the shifting signal SFT_S set to a logic "low" level at a time point when a fourth cycle interval of the internal clock ICLK elapses after the ground voltage VSS is selected in the first valid flag selector 281_1.

The second shifting circuit 273 may store the first pre-instruction signal INCT_P1, the second pre-instruction signal INCT_P2, the third pre-instruction signal INCT_P3, and the fourth pre-instruction signal INCT_P4 that are selected in the first to fourth instruction signal selectors 291_1-291_4 in the first to fourth instruction signal flip-flops 293_1-293_4, respectively, when the shifting signal SFT_S is activated at a logic "low" level. When the shifting signal SFT_S is set to a logic "high" level, the second shifting circuit 273 may sequentially shift the first pre-instruction signal INST_P1, the second pre-instruction signal INST_P2, the third pre-instruction signal INST_P3, and the fourth pre-instruction signal INST_P4 that are stored in the first to fourth instruction signal flip-flops 293_1-293_4, respectively, in synchronized with the internal clock ICL to output as the instruction signal INST through the first to sixth instruction signal flip-flops 293_1-293_6. It may be confirmed that the instruction signal INST output from the sixth instruction signal flip-flop 293_6 is effectively generated from the pre-instruction signal INST_P while stored at a logic "high" level in the sixth valid flag flip-flop 283_6.

FIG. 12 illustrates tables illustrating instruction signals INST according to an embodiment of the present disclosure.

As shown in table (a) of FIG. 12, the instruction signal INST, which is composed of 16 bits, may include 1 bit of information on use T/N, 5 bits of information on command NCMD/TCMD, and 10 bits of information on information BG/BK and ADD or instruction test information TIF. Whether the instruction signal INST is used for any of a self-test operation and a normal operation may be determined by the information on use T/N.

As shown in table (b) of FIG. 12, when the information on use T/N included in the instruction signal INST is set to a logic "low" level '0', the instruction signal INST may include 5 bits for a normal command NCMD for the normal operation, 5 bits for a bank group and a bank address BG/BK, and 5 bits for a row address and column address ADD.

As shown in table (c) of FIG. 12, when the information on use T/N included in the instruction signal INST is set to a logic "high" level '1', the instruction signal INST may include 5 bits for an instruction test command TCMD for a self-test operation and 10 bits for instruction test information TIF. The instruction test command TCMD may include information for generating one of a test read command TRD_CMD, a test write command TWT_CMD, and a switching signal JP. The instruction test information TIF may include information for generating one of address information for a test read operation, address information for a test write operation, and a switching address JP_ADD.

FIG. 13 illustrates a table illustrating an instruction signal INST according to another embodiment of the present disclosure.

As shown in FIG. 13, the instruction signal INST, which is composed of 32 bits, may include 1 bit of information on use T/N, 5 bits of information on instruction test command NCMD/TCMD, and 26 bits of information on instruction address BG/BK and ADD or instruction test information TIF. In the case of the instruction signal INST composed of 16 bits, only 10 bits of the information on instruction address BG/BK, ADD or the instruction test information TIF may be included, so that the instruction signal INST may include information on an indirect address for accessing a direct address ADD_D that is stored in an address register (307 of FIG. 14). In contrast, in the case of the instruction signal INST composed of 32 bits, because 26 bits of the information on instruction address BG/BK and ADD or the instruction test information TIF may be included, information on the direct address may be included.

Figure 14:
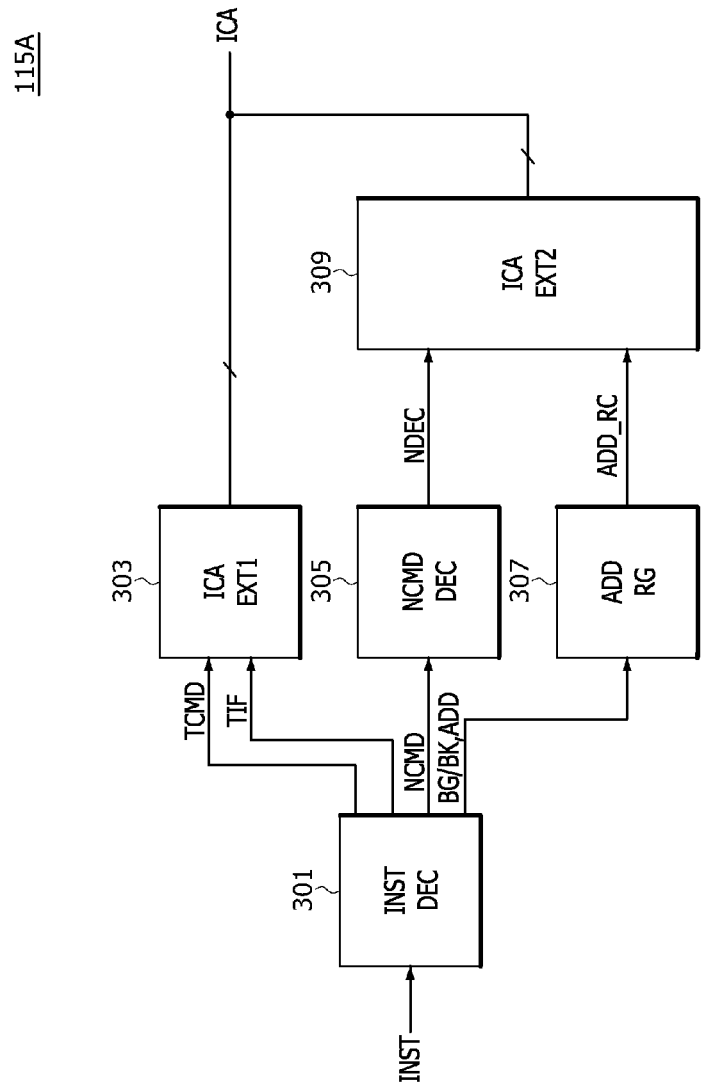
FIG. 14 is a block diagram illustrating a configuration according to an example of an internal control signal generating circuit shown in FIG. 2.

FIG. 14 is a block diagram illustrating a configuration of an internal control signal generating circuit 115A according to an example of the internal control signal generating circuit 115 shown in FIG. 2. As shown in FIG. 14, the internal control signal generating circuit 115A may include an instruction signal decoder (INST DEC) 301, a first internal control signal extracting circuit (ICA EXT1) 303, a normal command decoder (NCMD DEC) 305, an address register (ADD RG) 307, and a second internal control signal extracting circuit (ICA EXT2) 309.

The instruction signal decoder 301 may decode an instruction signal INST to generate an instruction test command TCMD, instruction test information TIF, an instruction normal command NCMD, and information on instruction address BG/BK and ADD. The instruction signal decoder 301 may be connected to the first internal control signal extracting circuit 303, the normal command decoder 305, and the address register 307 to apply the instruction test command TCMD and the instruction test information TIF to the first internal control signal extracting circuit 303, to apply the instruction normal command NCMD for a test normal operation to the normal command decoder 305, and to apply the information on instruction address BG/BK and ADD to the address register 307. The first internal control signal extracting circuit 303 may generate an internal control signal ICA for a self-test operation based on the instruction test command TCMD and the instruction test information TIF. The normal command decoder 305 may decode the instruction normal command NCMD to generate a normal decoding command NDEC. The normal command decoder 305 may be connected to the second internal control signal extracting circuit 309 to apply the normal decoding command NDEC to the second internal control signal extracting circuit 309. The address register 307 may output an internally stored direct address ADD_D based on the information on the instruction address BG/BK and ADD. The address register 307 may receive and store the direct address ADD_D according to a test mode or mode register set operation, and a logic bit set of bits included in the direct address ADD_D may be set to correspond to the logic bit set of bits included in the information on instruction address BG/BK and ADD. The address register 307 may be connected to the second internal control signal extracting circuit 309 to apply the direct address ADD_D to the second internal control signal extracting circuit 309. The second internal control signal extracting circuit 309 may generate an internal control signal ICA for a test normal operation based on the normal decoding command NDEC and the direct address ADD_D.

Although the internal control signal generating circuit 115A is implemented to include the address register 307 by setting the information on address BG/BK and ADD to include information on an indirect address for generating the direct address ADD_D, the internal control signal generating circuit 115A may be implemented without including the address register 307 by setting the information on address BG/BK and ADD to include the information on direct address according to embodiments.

Figure 15:
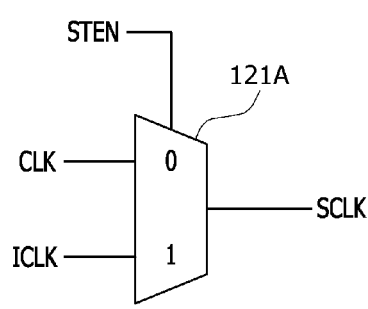
FIG. 15 is a diagram illustrating a configuration according to an example of a clock buffer circuit shown in FIG. 2.

FIG. 15 is a diagram illustrating a configuration of a clock buffer circuit 121A according to an example of the clock buffer circuit 121 shown in FIG. 2. As shown in FIG. 15, the clock buffer circuit 121A may output one of a clock CLK and an internal clock ICLK as a selection clock SCLK based on a self-test signal STEN. The clock buffer circuit 121A may output the internal clock ICLK as the selection clock SCLK when the self-test signal STEN is activated because a self-test operation is performed, and may output the clock CLK as the selection clock SCLK when the self-test signal STEN is deactivated because the self-test operation is not performed.

Figure 16:
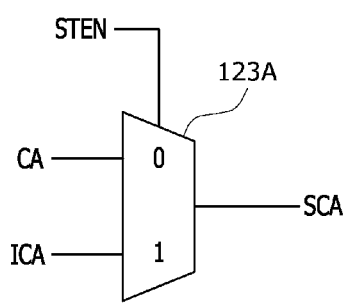
FIG. 16 is a diagram illustrating a configuration according to an example of a control signal buffer circuit shown in FIG. 2.

FIG. 16 is a diagram illustrating a configuration of a control signal buffer circuit 123A according to an example of the control signal buffer circuit 123 shown in FIG. 2. As shown in FIG. 16, the control signal buffer circuit 123A may output one of a control signal CA and an internal control signal ICA as a selection control signal SCA based on a self-test signal STEN. The control signal buffer circuit 123A may output the internal control signal ICA as the selection control signal SCA when the self-test signal STEN is activated because a self-test operation is performed, and may output the control signal CA as the selection control signal SCA when the self-test signal STEN is deactivated because the self-test operation is not performed.

Figure 17:
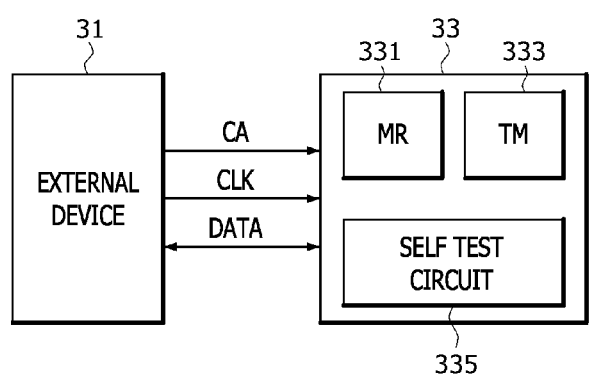
FIG. 17 is a block diagram illustrating a configuration of a semiconductor system according to an embodiment of the present disclosure.

FIG. 17 is a block diagram illustrating a configuration of a semiconductor system 3 according to an embodiment of the present disclosure. As shown in FIG. 17, the semiconductor system 3 may include an external device 31 and a semiconductor device 33.

The external device 31 may apply a control signal CA and a clock CLK to the semiconductor device 33 to control the semiconductor device 33 to perform a self-test operation or a normal operation. The external device 31 may apply data DATA to the semiconductor device 33 and receive data DATA from the semiconductor device 33. The external device 31 may include a test device (not shown), a controller (1002 in FIG. 21, 1300 in FIG. 22), and the like.

The semiconductor device 33 may include a mode register 331, a test mode control circuit 333, and a self-test circuit 335. The mode register 331 may store various pieces of information for the self-test operation by a mode register set operation. The test mode control circuit 333 may store various pieces of information for the self-test operation by the test mode operation. The self-test circuit 335 may perform the self-test operation based on information stored in the mode register 331 and the test mode control circuit 333. The semiconductor device 33 may be implemented to include the self-test circuit 101A, the command control circuit 103A, and the data control circuit 105A shown in FIG. 2.

Figure 18:
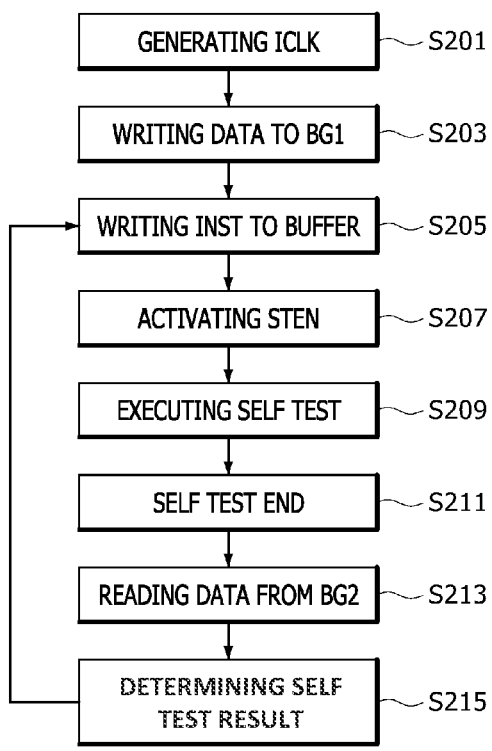
FIG. 18 is a flowchart illustrating a test operation performed in the semiconductor system shown in FIG. 17.

FIG. 18 is a flowchart illustrating a test operation performed in the semiconductor system 3 shown in FIG. 17.

As shown in FIGS. 17 and 18, the semiconductor system 3 may receive the clock CLK from the external device 31 to generate the internal clock ICLK (S201). As described above with reference to FIGS. 3 and 4, the semiconductor device 33 may generate the internal clock ICLK that is calibrated to have a frequency higher than that of the clock CLK.

As shown in FIGS. 17 and 18, the external device 31 may control the semiconductor device 33 to perform a normal write operation in which data DATA is stored in a first bank group BG1 included in the semiconductor device 33 (S203). In addition, the external device 31 may control the semiconductor device 33 to perform a normal write operation in which the instruction signal INST is stored in a buffer included in the semiconductor device 33 (S205).

As shown in FIG. 18, when the self-test signal STEN is activated (S207), a self-test operation may be performed in the semiconductor device 33 (S209). Whether the self-test signal STEN is activated may be adjusted according to the control of the external device 31 such as the mode register set operation or the test mode operation. The self-test operation may be implemented as a test read operation and a test write operation sequentially performed according to a test read command TRD_CMD and a test write command TWT_CMD that are generated from the instruction signal INST stored in the semiconductor device 33, as described above with reference to FIG. 2. Data stored in the first bank group BG1 may be output by the test read operation, and the data output from the first bank group BG1 may be stored in a second bank group BG2 by the test write operation.

As shown in FIG. 18, when the self-test operation is finished (S211), the external device 31 may control the semiconductor device 33 to perform a normal read operation in which data stored in the second bank group BG2 is output (S213). The external device 31 may determine the result of the self-test operation based on the data output from the second bank group BG2 (S213). More specifically, the external device 31 may determine whether the data stored in the second bank group BG2 is the same as the data DATA stored in the first bank group BG1 when the normal write operation is previously performed (S203), and may check whether the memory cells included in the first bank group BG1 and the second bank group BG2 on which the self-test operation is performed are defective.

As shown in FIG. 18, the external device 31 may repeatedly perform operations from storing the instruction signal INST in the buffer included in the semiconductor device 33 (S203) to determining the result of the self-test operation (S215) so that the self-test motions of different patterns are repeatedly performed.

Figure 19:
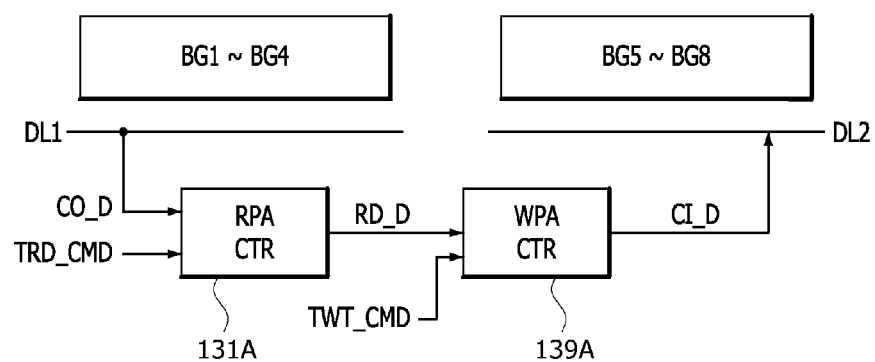
FIGS. 19 to 20 are diagrams illustrating a self-test operation performed in the semiconductor system shown in FIG. 17.
Figure 20:
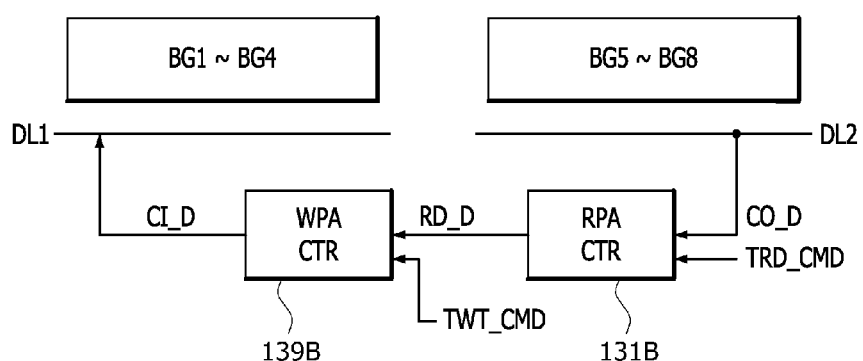

FIGS. 19 to 20 are diagrams illustrating a self-test operation performed in the semiconductor system 3 shown in FIG. 17.

First, an example of the self-test operation may be implemented as a test read operation performed by a read path circuit 131A and a test write operation performed by a write path circuit 139A, as shown in FIG. 19. The read path circuit 131A may perform the test read operation in a method of receiving data stored in first to fourth bank groups BG1-BG4 through a first data line DL1 and outputting the data as read data RD_D based on a test read command TRD_CMD. The write path circuit 139A may perform the test write operation in a method of generating cell input data CI_D stored in fifth to eighth bank groups BG5-BG8 from the read data RD_D through a second data line DL2 based on a test write command TWT_CMD.

Next, another example of the self-test operation may be implemented as a test read operation performed by the read path circuit 131B and a test write operation performed by the write path circuit 139B, as shown in FIG. 20. The read path circuit 131B may perform the test read operation in a method of receiving data stored in the fifth to eighth bank groups BG5-BG8 through the second data line DL2 and outputting the data as read data RD_D based on the test lead command TRD_CMD. The write path circuit 139A may perform the test write operation in a method of generating the cell input data CI_D stored in the first to fourth bank groups BG1-BG4 through the first data line DL1 from the read data RD_D based on the test write command TWT_CMD.

The semiconductor device 10 illustrated in FIG. 1 and the semiconductor system 3 illustrated in FIG. 17 may be applied to an electronic system including a memory system, a graphic system, a computing system, and a mobile system. For example, referring to FIG. 21, an electronic system 1000 according to an embodiment of the present disclosure may include a data storage device 1001, a memory controller 1002, a buffer memory device 1003, and an input/output interface 1004.

The data storage device 1001 may store data (not shown) that is applied from the memory controller 1002 according to a control signal from the memory controller 1002, and may read out stored data (not shown) to output the data to the memory controller 1002. Meanwhile, the data storage device 1001 may include non-volatile memory devices capable of continuously storing data without losing data even when power is cut off. The non-volatile memory device may include a flash memory device (NOR flash memory device, NAND flash memory device), a phase change random access memory (PRAM) device, a resistive random access memory (RRAM) device, a spin transfer torque random access memory (STTRAM) device, or a magnetic random access memory (MRAM) device.

The memory controller 1002 may decode instructions applied from an external device (host device) through the I/O interface 1004, and may control data input and output for the data storage device 1001 and the buffer memory 1003 according to a decoding result. Although the memory controller 1002 is represented as one block in FIG. 21, a controller for controlling the data storage device 1001 and a controller for controlling the buffer memory device 1003 which is a volatile memory device may be configured independently in the memory controller 1002. The memory controller 1002 may include the external device 31 described above with reference to FIG. 17.

The buffer memory device 1003 may temporarily store data to be processed by the memory controller 1002, that is, the data (not shown) input or output to or from the data storage device 1001. The buffer memory device 1003 may store the data (not shown) applied from the memory controller 1002 according to a control signal. The buffer memory 1003 may include the semiconductor device 10 described above with reference to FIG. 1 or the semiconductor device 33 described above with reference to FIG. 17. The buffer memory device 1003 may read out stored data to output the data to the memory controller 1002. The buffer memory device 1003 may include a volatile memory device such as a dynamic random access memory (DRAM) device, a mobile DRAM device, or a static random access memory (SRAM) device.

The I/O interface 1004 may provide physical connection between the memory controller 1002 and an external device (host device) to enable the memory controller 1002 to receive a control signal for data input/output from the external device and to exchange data with the external device. The I/O interface 1004 may include one of various interface protocols such as USB, MMC, PCI-E, SAS, SATA, PATA, SCSI, ESDI, and IDE.

The electronic system 1000 may be used as an auxiliary storage device of a host device or an external storage device. The electronic system 1000 may include a solid state disk (SSD), a universal serial bus (USB) memory, a secure digital (SD) card, a mini secure digital (mSD) card, a micro secure digital (micro SD) card, secure digital high capacity (SDHC), a memory stick card, a smart media (SM) card, a multimedia card (MMC), an embedded multimedia card (eMMC), a compact flash (CF) card, and the like.

Figure 22:
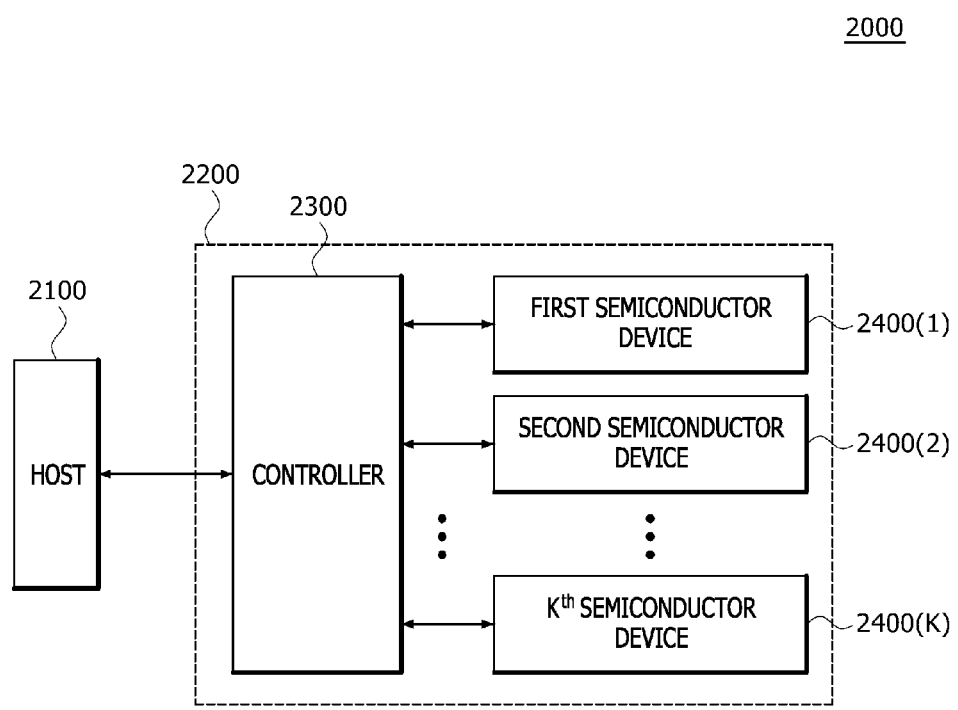
FIG. 22 is a block diagram illustrating a configuration of a semiconductor system according to another embodiment of the present disclosure.

FIG. 22 is a block diagram illustrating a configuration of an electronic system 2000 according to another embodiment of the present disclosure. As shown in FIG. 22, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may include the external device 31 shown in FIG. 17. Each of the semiconductor devices 2400(1:K) may include the semiconductor device 10 described above with reference to FIG. 1 or the semiconductor device 33 described above with reference to FIG. 17. Each of the semiconductor devices 2400(1:K) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM) device.

Concepts have been disclosed in conjunction with some embodiments as described above. Those skilled in the art will appreciate that various modifications, additions, and/or substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all distinctive features in the equivalent scope should be construed as being included in the concepts.

What is claimed is:

1. A semiconductor device comprising:
a self-test circuit configured to generate an internal clock having a higher frequency than a clock applied from a device external to the semiconductor device, to generate an instruction signal from a pre-instruction signal extracted through a data line, and to generate an internal control signal from the instruction signal;
a command control circuit configured to generate a test command to perform a self-test for determining whether a defect has occurred in first memory cells and second memory cells of the semiconductor device based on the internal clock and the internal control signal; and
a data control circuit configured to output data stored in the first memory cells and to store the data output from the first memory cells in the second memory cells based on the test command.

2. The semiconductor device of claim 1, wherein the self-test circuit includes an internal clock generating circuit configured to count the clock a preset number of times, and then, to calibrate a frequency of the internal clock based on a result of counting the clock.

3. The semiconductor device of claim 2, wherein the internal clock generating circuit includes:
an oscillating circuit configured to generate the internal clock based on an oscillating enable signal, a first calibration signal, and a second calibration signal;
a detection signal generating circuit configured to compare a first counting signal generated by counting the clock with a first setting code to generate a detection signal; and
a calibration signal generating circuit configured to compare a second counting signal generated by counting the internal clock with a second setting code to generate the first calibration signal and the second calibration signal based on the detection signal.

4. The semiconductor device of claim 3, wherein the oscillating circuit is configured to set the internal clock to have an initialized frequency when the oscillating enable signal is activated.

5. The semiconductor device of claim 3, wherein the oscillating circuit is configured to calibrate the frequency of the internal clock to be:
slower when the first calibration signal is activated, and
faster when the second calibration signal is activated.

6. The semiconductor device of claim 3,
wherein the internal clock generating circuit further includes:
a clock counter configured to count the clock to generate the first counting signal; and
an internal clock counter configured to count the internal clock to generate the second counting signal,
wherein the clock counter and the internal clock counter are configured to be initialized based on a counter reset signal, and
wherein each of the clock counter and the internal clock counter are configured to perform a counting operation based on a counter enable signal.

7. The semiconductor device of claim 3, wherein the detection signal generating circuit is configured to generate the detection signal that is activated when the first counting signal is the same as the first setting code.

8. The semiconductor device of claim 3, wherein the calibration signal generating circuit is configured to:
generate the first calibration signal for calibrating the frequency of the internal clock to be slower when the detection signal is activated and the second counting signal is greater than a setting value that is set by the second setting code, and
generate the second calibration signal for calibrating the frequency of the internal clock to be faster when the detection signal is activated and the second counting signal is smaller than a setting value that is set by the second setting code.

9. The semiconductor device of claim 1, wherein the self-test circuit includes an instruction signal control circuit configured to generate the instruction signal based on the pre-instruction signal that is extracted through the data line based on the internal clock and a buffer input signal.

10. The semiconductor device of claim 9, wherein the instruction signal control circuit includes:
   a pre-instruction signal generating circuit configured to store the pre-instruction signal that is extracted through the data line based on the buffer input signal, and to output the pre-instruction signal based on a buffer output signal; and
   a pre-instruction signal shifting circuit configured to shift the pre-instruction signal in synchronization with the internal clock to generate the instruction signal based on a shifting signal.

11. The semiconductor device of claim 10, wherein the pre-instruction signal generating circuit includes:
   a pre-instruction signal buffer circuit configured to store the pre-instruction signal that is received through a local data line, or to output the pre-instruction signal stored in the pre-instruction signal buffer circuit to the local data line based on the buffer input signal and the buffer output signal; and
   a pre-instruction signal input/output circuit configured to transmit the pre-instruction signal that is extracted through the data line to the local data line, or to output the pre-instruction signal that is received through the local data line based on the buffer input signal and the buffer output signal.

12. The semiconductor device of claim 11, wherein the instruction signal control circuit further includes a buffer output signal generating circuit configured to generate the buffer output signal based on the buffer input signal, a counting pulse, a switching signal, and a switching address.

13. The semiconductor device of claim 12, wherein the buffer output signal generating circuit is configured to activate a first bit of the buffer output signal based on the buffer input signal, and then, to sequentially activate remaining bits from a second bit of the buffer output signal based on the counting pulse.

14. The semiconductor device of claim 12, wherein the buffer output signal generating circuit is configured to generate the buffer output signal so that the pre-instruction signal is output from the pre-instruction signal buffer circuit that corresponds to the switching address when the switching signal is generated.

15. The semiconductor device of claim 12, wherein the instruction signal control circuit further includes a switching control circuit configured to generate the switching signal and the switching address based on the instruction signal.

16. The semiconductor device of claim 10, wherein the instruction signal control circuit further includes a shifting signal initialization circuit configured to initialize the shifting signal based on the buffer output signal.

17. The semiconductor device of claim 10, wherein the pre-instruction signal shifting circuit includes:
   a first shifting circuit configured to store one of a first voltage and a second voltage based on the shifting signal, and to sequentially shift the stored one of the first shifting circuit to set a valid flag based on the internal clock; and
   a second shifting circuit configured to store one of the pre-instruction signal and the second voltage based on the shifting signal, and to sequentially shift the stored one of the second shifting circuit to generate the instruction signal based on the internal clock.

18. The semiconductor device of claim 17, wherein the valid flag is used to confirm whether the instruction signal is effectively generated from the pre-instruction signal.

19. The semiconductor device of claim 1, wherein the self-test circuit includes an internal control signal generating circuit configured to generate the internal control signal including an instruction test command and instruction test information based on the instruction signal.

20. The semiconductor device of claim 19, wherein the internal control signal generating circuit includes:
   an instruction signal decoder configured to decode the instruction signal to generate the instruction test command, the instruction test information, an instruction normal command, and information on an instruction address;
   a first internal control signal extracting circuit configured to generate the internal control signal for the self-test based on the instruction test command and the instruction test information; and
   a second internal control signal extracting circuit configured to generate the internal control signal for a normal test based on the instruction normal command and the information on the instruction address.

21. The semiconductor device of claim 1, wherein the command control circuit includes:
   a clock buffer circuit configured to output one of the clock and the internal clock as a selection clock based on a self-test signal;
   a control signal buffer circuit configured to output one of a control signal and the internal control signal as a selection control signal based on the self-test signal; and
   an internal command generating circuit configured to generate a test read command for a test read operation and a test write command for a test write operation based on the selection clock and the selection control signal.

22. The semiconductor device of claim 1, wherein the data control circuit is configured to:
   output data that is stored in the first memory cells in response to a test read command; and
   store data that is output from the first memory cells in the second memory cells in response to a test write command.

23. The semiconductor device of claim 1, wherein the first memory cells are included in first bank groups, and the second memory cells are included in second bank groups.

24. The semiconductor device of claim 1,
   wherein the self-test circuit and the command control circuit are positioned between the first bank groups, and
   wherein the data control circuit is positioned between the second bank groups.

25. A semiconductor device comprising:
   an internal clock generating circuit configured to count a clock a preset number of times, and then, to calibrate a frequency of the internal clock based on a result of counting the clock;
   an instruction signal control circuit configured to generate an instruction signal based on a pre-instruction signal that is extracted through a data line based on the internal clock and a buffer input signal;
   an internal control signal generating circuit configured to generate an internal control signal including an instruction test command and instruction test information based on the instruction signal; and a command control circuit configured to generate a test command to perform a self-test for determining whether a defect has occurred in first memory cells and second memory cells of the semiconductor device based on the internal clock and the internal control signal.

26. The semiconductor device of claim 25, wherein the internal clock generating circuit includes:
an oscillating circuit configured to generate the internal clock based on an oscillating enable signal, a first calibration signal, and a second calibration signal;
a detection signal generating circuit configured to compare a first counting signal generated by counting the clock with a first setting code to generate a detection signal; and
a calibration signal generating circuit configured to compare a second counting signal generated by counting the internal clock with a second setting code to generate the first calibration signal and the second calibration signal based on the detection signal.

27. The semiconductor device of claim 26, wherein the oscillating circuit is configured to:
set the internal clock to have an initialized frequency when the oscillating enable signal is activated,
calibrate the frequency of the internal clock to be slower when the first calibration signal is activated, and
calibrate the frequency of the internal clock to be faster when the second calibration signal is activated.

28. The semiconductor device of claim 26,
wherein the detection signal generating circuit is configured to generate the detection signal that is activated when the first counting signal is the same as the first setting code, and
wherein the calibration signal generating circuit is configured to:
generate the first calibration signal for calibrating the frequency of the internal clock to be slower when the detection signal is activated and the second counting signal is greater than a setting value that is set by the second setting code, and
generate the second calibration signal for calibrating the frequency of the internal clock to be faster when the detection signal is activated and the second counting signal is smaller than the setting value that is set by the second setting code.

29. The semiconductor device of claim 25, wherein the instruction signal control circuit includes:
a pre-instruction signal generating circuit configured to store the pre-instruction signal that is extracted through the data line based on the buffer input signal, and to output the pre-instruction signal based on a buffer output signal; and
a pre-instruction signal shifting circuit configured to shift the pre-instruction signal in synchronization with the internal clock to generate the instruction signal based on a shifting signal.

30. The semiconductor device of claim 29, wherein the pre-instruction signal generating circuit includes:
a pre-instruction signal buffer circuit configured to store the pre-instruction signal that is received through a local data line, or to output the pre-instruction signal stored in the pre-instruction signal buffer circuit to the local data line based on the buffer input signal and the buffer output signal; and
a pre-instruction signal input/output circuit configured to transmit the pre-instruction signal that is extracted through the data line to the local data line, or to output the pre-instruction signal that is received through the local data line based on the buffer input signal and the buffer output signal.

31. The semiconductor device of claim 29, wherein the pre-instruction signal shifting circuit includes:
a first shifting circuit configured to store one of a first voltage and a second voltage based on the shifting signal, and to sequentially shift the stored one of the first shifting circuit based on the internal clock to set a valid flag; and
a second shifting circuit configured to store one of the pre-instruction signal and the second voltage based on the shifting signal, and to sequentially shift the stored one of the second shifting circuit based on the internal clock to generate the instruction signal.

32. The semiconductor device of claim 29, wherein the instruction signal control circuit further includes a buffer output signal generating circuit configured to generate the buffer output signal based on the buffer input signal, a counting pulse, a switching signal, and a switching address.

33. The semiconductor device of claim 25, wherein the internal control signal generating circuit includes:
an instruction signal decoder configured to decode the instruction signal to generate the instruction test command, the instruction test information, an instruction normal command, and information on an instruction address;
a first internal control signal extracting circuit configured to generate the internal control signal for the self-test based on the instruction test command and the instruction test information; and
a second internal control signal extracting circuit configured to generate the internal control signal for a normal test based on the instruction normal command and the information on the instruction address.

34. The semiconductor device of claim 25, wherein the command control circuit includes:
a clock buffer circuit configured to output one of the clock and the internal clock as a selection clock based on a self-test signal;
a control signal buffer circuit configured to output one of a control signal and the internal control signal as a selection control signal based on the self-test signal; and
an internal command generating circuit configured to generate a test read command for a test read operation and a test write command for a test write operation based on the selection clock and the selection control signal.

35. The semiconductor device of claim 25, further comprising a data control circuit configured to output data stored in the first memory cells, and to store data output from the first memory cells in the second memory cells based on the test command.

36. A method of performing a test, the method comprising:
generating an internal clock that is calibrated to have a higher frequency than a clock;
storing data in first memory cells according to a normal write operation;
storing an instruction signal in a buffer according to the normal write operation;
generating an internal control signal from the instruction signal;
generating a test command to perform a self-test to determine whether a defect has occurred in the first memory cells and second memory cells based on the internal clock and the internal control signal; and outputting the data stored in the first memory cells and storing the data output from the first memory cells in the second memory cells based on the test command.

37. The method of claim 36, wherein generating the internal clock is performed by counting the clock a preset number of times, and then, calibrating the frequency of the internal clock based on a result of counting the clock.

38. The method of claim 36, wherein generating the internal clock includes:
comparing a first counting signal generated by counting the clock with a first setting code to generate a detection signal;
comparing a second counting signal generated by counting the internal clock with a second setting code to generate a first calibration signal and a second calibration signal based on the detection signal; and
generating the internal clock based on an oscillating enable signal, the first calibration signal, and the second calibration signal.

39. The method of claim 36, wherein generating the internal control signal from the instruction signal includes:
storing a pre-instruction signal extracted through a data line based on a buffer input signal, and outputting the pre-instruction signal based on a buffer output signal; and
shifting the pre-instruction signal in synchronization with the internal clock to generate the instruction signal based on a shifting signal.

40. The method of claim 39, wherein generating the internal control signal from the instruction signal further includes generating the internal control signal including an instruction test command and an instruction test information based on the instruction signal.

41. The method of claim 36, wherein generating the test command includes:
outputting one of the clock and the internal clock as a selection clock based on a self-test signal;
outputting one of a control signal and the internal control signal as a selection control signal based on the self-test signal; and
generating a test read command for a test read operation and a test write command for a test write operation based on the selection clock and the selection control signal.

* * * * *